(12) United States Patent
Kim

(10) Patent No.: US 7,642,019 B2
(45) Date of Patent: Jan. 5, 2010

(54) METHODS FOR MONITORING AND ADJUSTING FOCUS VARIATION IN A PHOTOLITHOGRAPHIC PROCESS USING TEST FEATURES PRINTED FROM PHOTOMASK TEST PATTERN IMAGES; AND MACHINE READABLE PROGRAM STORAGE DEVICE HAVING INSTRUCTIONS THEREFORE

(75) Inventor: Ho-Chul Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 684 days.

(21) Appl. No.: 11/324,739

(22) Filed: Jan. 3, 2006

(65) Prior Publication Data

US 2006/0234136 A1 Oct. 19, 2006

Related U.S. Application Data

(60) Provisional application No. 60/671,626, filed on Apr. 15, 2005, provisional application No. 60/673,669, filed on Apr. 21, 2005.

(51) Int. Cl.
*G03F 7/207* (2006.01)
*G01B 11/00* (2006.01)
*G06G 7/48* (2006.01)

(52) U.S. Cl. .......... 430/30; 430/311; 356/624; 356/636; 703/6

(58) Field of Classification Search .......... 430/30
See application file for complete search history.

(56) References Cited

U.S. PATENT DOCUMENTS

| 5,300,786 | A | 4/1994 | Brunner et al. | |
| 6,063,531 | A * | 5/2000 | Singh et al. | 430/30 |
| 6,828,080 | B2 * | 12/2004 | Nakao | 430/311 |
| 2003/0031943 | A1 | 2/2003 | Nakao et al. | |
| 2003/0095267 | A1 | 5/2003 | Mieher et al. | |
| 2003/0175600 | A1 | 9/2003 | Jeong et al. | |
| 2004/0115539 | A1 | 6/2004 | Broeke et al. | 430/5 |

OTHER PUBLICATIONS

English Translation of German Office Action dated Dec. 5, 2008 in corresponding German Appln. No. 10 2006 017 938.2-51.

* cited by examiner

*Primary Examiner*—Mark F Huff
*Assistant Examiner*—John Ruggles
(74) *Attorney, Agent, or Firm*—F.Chau & Associates, LLC

(57) ABSTRACT

Systems and methods are provided for detecting focus variation in a lithographic process using photomasks having test patterns adapted to print test features with critical dimensions that can be measured and analyzed to determine magnitude and direction of defocus from a best focus position of an exposure tool during the lithographic process.

15 Claims, 19 Drawing Sheets

METHODS FOR MONITORING AND ADJUSTING FOCUS VARIATION IN A PHOTOLITHOGRAPHIC PROCESS USING TEST FEATURES PRINTED FROM PHOTOMASK TEST PATTERN IMAGES; AND MACHINE READABLE PROGRAM STORAGE DEVICE HAVING INSTRUCTIONS THEREFORE

CROSS-REFERENCE TO RELATED APPLICATIONS

This application claims priority to U.S. Provisional Application Ser. Nos. 60/671,626 filed on Apr. 15, 2005, and 60/673,669 filed on Apr. 21, 2005. which are both fully incorporated herein by reference.

TECHNICAL FIELD OF THE INVENTION

The present invention relates generally systems and methods for detecting focus drifts in a photolithographic process. More specifically, the invention relates to methods for constructing photomasks with test patterns adapted to print test features with critical dimensions that can be measured and analyzed to determine magnitude and direction of defocus from a best focus position of an exposure tool during a lithographic process.

BACKGROUND

Photolithography is an integral process in manufacturing semiconductor IC (integrated circuit) devices. In general, a photolithographic process includes coating a semiconductor wafer (or substrate) with a layer of photoresist, and exposing the photoresist with an actinic light source (such as an excimer laser, mercury lamp, etc.,) through a photomask having an image of an integrated circuit. For example, a lithographic tool, such as a deepUV stepper can be used to project light through a photomask and a high aperture lens onto a photoresist layer, where the light intensity casts the photomask pattern onto the photoresist Various types of photomasks have been developed for lithography including, binary masks, embedded attenuated phase shift masks (EAPSM), alternating aperture phase-shift masks (AAPSM), as well as various hybrid mask types.

Currently, highly integrated circuit (IC) devices are being designed with IC device features having small critical dimensions. The critical dimension (CD) refers to the smallest width of a line or the smallest space between two lines that is specified according to design rules for a given device fabrication process. In fact, IC devices are currently being built with sub-wavelength feature sizes, where the circuit images printed on the silicon wafer are smaller than the wavelength of the light source used to expose the pattern. For example, state of the art DUV steppers use an argon fluoride (ArF) laser with a wavelength of 193 nm to form integrated circuits with feature sizes of 100 nm (0.1 micron) and below.

As feature patterns become increasing smaller (e.g., sub-wavelength features), however, it becomes increasingly difficult to meet critical dimension requirements as a result of optical proximity effects (OPE) which decrease the lithographic process window for printing sub-wavelength features. The OPE phenomenon occurs due to diffraction of light waves of closely spaced, adjacent circuit features which causes the light waves to interact in a way to distort the transferred pattern features and produce pattern-dependent process variations. In this regard, various techniques have been developed to mitigate or compensate for the effects of OPE when printing sub-wavelength features.

For example, well-known reticle enhancement techniques, such as optical proximity correction (OPC) and phase shift mask (PSM) techniques, are used for constructing photomasks. With OPC, small sub-resolution (nonprinting) features (such as "scatter bars") are incorporated in circuit mask patterns to compensate for proximity effects. Further, PSM techniques are used to construct photomasks (e.g., alternating aperture phase-shift masks, embedded attenuated phase-shift masks, etc.) having mask patterns with phase-shifting structures designed to reduce proximity effects and enhance the contrast at critical edges of sub-wavelength features. On the other hand, as compared to PSM structures, binary masks are generally known to be more susceptible to OPE due to diffraction, which limits the ability to use binary masks for lithographic printing of sub-wavelength features.

FIGS. 1A, 1B and 1C schematically illustrate a conventional photolithography process using a binary mask structure. In particular, FIG. 1A is a top plan view of a binary photomask (10) and FIG. 1B is a schematic cross-sectional view of the binary photomask (10) along line 1B-1B in FIG. 1A. In general, the binary mask (10) comprises a mask pattern (11) formed on a mask substrate (12). The mask substrate (12) is formed of a material that is transparent to exposure light of a given wavelength of the exposure light. For example, the substrate (12) is typically formed of high-purity quartz or glass. For a binary mask, the image pattern (11) is typically formed of a light blocking material such as chromium (Cr) having a transmittance of about 0% at the given wavelength which operates to block (and reflect) the passage of light. In this regard, a binary mask is deemed a reflective mask.

In FIGS. 1A and 1B, the mask pattern (11) includes a plurality of elongated parallel line features (11a) with pitch P, and spaces (11b) formed by etching a layer of light blocking material (e.g., Cr) on the mask substrate (12). The mask pattern (11) can be transferred to a photoresist layer on the substrate through a lithographic process. In particular, as depicted in FIG. 1B, during an exposure process, light of a given wavelength incident on the patterned surface of the mask (10) can be projected through the exposed regions (e.g., spaces 11b) of the photomask (10) onto a photoresist (resist) coated wafer such that the regions of the photoresist aligned to the spaces (11b) are exposed to light. With a positive resist, for example, the exposed regions of the photoresist can be removed during development such that mask pattern (11) is printed in the photoresist.

As the critical dimensions of the features to be printed become smaller and approach the resolution of the lithography exposure tool, the ability to accurately print small features using binary mask techniques, per se, is significantly reduced due to optical proximity effects due to diffraction. This limitation is schematically illustrated in FIG. 1C. In particular, FIG. 1C illustrates a semiconductor device (14) including a photoresist layer (15) formed on a semiconductor substrate (16) (e.g., wafer). In FIG. 1C, it is assumed that the photoresist layer (15) is a "positive resist" exposed using the binary mask (10) of FIGS. 1A and 1B with 1× reduction. It is further assumed that the critical dimensions of the line features (11a) and spaces (11b) to be printed are close to the resolution limit of the exposure system.

As depicted in FIG. 1C, the optical proximity effects due to the closely spaced line features (11a) prevents the line-space patterns from being printed in the photoresist (15). In particular, FIG. 1C depicts the electric field curve (13) (magnitude and direction) in the wafer plane across the photoresist (15) due to diffraction effects. In particular, because of the small sizes of the line and space features (11a, 11b), diffraction effects of incident light on the photoresist (15) causes the electric field vectors of adjacent space features (11b) to interact and add constructively such that the light intensity increases at regions of the photoresist (15) aligned to the line features (11a). FIG. 1C illustrates a circumstance in which the electric field (13) meets or exceeds the photoresist exposure threshold Tp across the entire region of the photoresist aligned to the line-space pattern (11a, 11b). As a result the line features (11a) are not printed and the space features (11b) are printed in the photoresist (15) as a single, wide space feature rather than discrete space features. These diffraction effects can be mitigated using PSM techniques.

For instance, FIGS. 2A, 2B and 2C schematically illustrate a conventional photolithography process using an EAPSM (Embedded Attenuated Phase Shift Mask) structure. In particular, FIG. 2A is a top plan view of an EAPSM structure (20) and FIG. 2B is a schematic cross-sectional view of the EAPSM structure (20) along line 2B-2B in FIG. 2A. In general, the EAPSM structure (20) comprises a mask pattern (21) formed on a mask substrate (22). The mask substrate (22) is formed of a material, such as high-purity quartz or glass, which is transparent at a given wavelength of the exposure light. The mask pattern (21) is formed of a light blocking material (or phase-shift material), such as molybdenum silicide (MoSi), having a transmittance in a range of 2-10%, at the given wavelength. FIGS. 2A and 2B depict a mask pattern (21) that includes a plurality of elongated parallel line features (21a) with pitch P, and spaces (21b), similar to the line-space mask pattern of FIGS. 1A/B. As compared to the photomask (10) of FIGS. 1A/B, the photomask (20) in FIG. 2A/2B causes DUV destructive interference at the wafer level, which enables line features to be more accurately printed as subwavelength dimensions smaller than the wavelength of light. This is conceptually illustrated in FIG. 2C.

In particular, FIG. 2C illustrates a semiconductor device (24) including a photoresist layer (25) formed on a semiconductor substrate (26) (e.g., wafer). In FIG. 2C, it is assumed that the photoresist layer (25) is a "positive resist" exposed using the binary mask (20) of FIGS. 2A/2B with 1× reduction. FIG. 2C depicts a resulting electric field curve (23) (magnitude and direction) in a wafer plane across the photoresist (25). The line features (21a) allow a small percentage of incident light to pass through the mask substrate (22) to the photoresist, but the intensity of such light is weak and does not expose the resist (25) on the wafer (26). The mask line features (21a) induce a 180 degree phase-shift of light passing through the mask (20) as compared to light that passes through the mask (20) at exposed regions of the substrate (22) (at space features (21b), which increases the image contrast at critical edges of the mask features and, thus, increase the resolution of the lithography process. More specifically, as depicted in FIG. 2C, destructive interference occurs at the critical edges of the line features (21a) adjacent the glass. In this regard, the electric field intensity is maintained well below the resist threshold Tp at regions of the photoresist (25) aligned to the mask line features (21a), enabling increased resolution for printing line-space patterns with subwavelength CDs using currently available lithographic tools.

Alternating aperture is another PSM technique that relies on DUV destructive interference to reduce the effects of OPE and print sub-wavelength features. For example, FIGS. 3A, 3B and 3C schematically illustrate a conventional photolithography process using an AAPSM (Alternating Aperture Phase Shift Mask). In particular, FIG. 3A is a top plan view of an AAPSM structure (30) and FIG. 3B is a schematic cross-sectional view of the AAPSM structure (30) along line 3B-3B in FIG. 3A. In general, the AAPSM structure (30) comprises a mask pattern (31) formed on a mask substrate (32). The mask substrate (32) is formed of a material, such as high-purity quartz or glass, which is transparent at a given wavelength of the exposure light. The mask pattern (31) is formed of a light blocking material such as chromium (Cr) having a transmittance of about 0% at the given wavelength which operates to block (and reflect) the passage of light. FIGS. 3A and 3B depict a mask pattern (31) that includes a plurality of elongated parallel line features (31a) with pitch P, and spaces (31b), similar to the line-space mask pattern of FIGS. 1A/1B. As compared to the photomask (10) of FIGS. 1A/1B, the photomask (30) in FIG. 3A/3B further includes trenches (32a) that are selectively etched into the mask (quartz) substrate (32) in every other one of the space features (31b). The trenches (32a) generate a 180 degree phase shift relative to those regions of the mask substrate that are not etched. The resulting phase differences lead to DUV destructive interference, which improves image contrast. This is conceptually illustrated in FIG. 3C.

In particular, FIG. 3C illustrates a semiconductor device (34) including a photoresist layer (35) formed on a semiconductor substrate (36) (e.g., wafer). In FIG. 3C, it is assumed that the photoresist layer (35) is a "positive resist" exposed using the binary mask (30) of FIGS. 3A/3B with 1× reduction. FIG. 3C depicts a resulting electric field curve (33) (magnitude and direction) in a wafer plane across the photoresist (35). The space features (31b) allow incident light to pass through the trash substrate (32) to the photoresist, whereas the line features (31a) reflect light. The trenches (32a) induce a 180 degree phase-shift of light passing through the mask (30) as compared to light that passes through the mask (30) though the exposed, unetched regions of the substrate (32) at space features (31b). As a result, the electric field (33) will be of equal magnitude and opposite phase on opposite sides of the line features (31a) and destructive interference occurs in the transitions between the etched and unetched regions produces a dark area that enhances the image contrast for printing the line-space features (31a, 31b) in the resist (35) with high precision.

Although PSM techniques discussed above can be generally used to provide increased resolution for printing sub-wavelength features, the quality with which such features can be replicated lithographically depends primarily on the size of the lithographic process window. In general, as is well known in the art, the term "process window" refers the amount of variation in exposure dose and focus which can be tolerated so that the characteristics of printed photoresist features (e.g., line width, wall angle, resist thickness) are maintained within prescribed specifications. For a given lithographic environment, the sensitivity of such photoresist features to changes in exposure dose and focus can be determined experimentally (or through computer simulations) by obtaining a matrix of focus-exposure data. For instance, for a given lithographic process and mask, the data of a focus-exposure matrix data can be used to determine variation of line width as a function of focus and exposure dose.

FIG. 4A is an exemplary Bossung (focus-exposure) plot which includes parametric curves of line width (CD) versus focus with exposure dose as a parameters. In, particular, the exemplary Bossung Plot illustrates the variation in CD (y-axis) as a function of defocus (x-axis) at different exposure energies (E1~E5). In FIG. 4A, a dotted line (40) denotes a target (nominal) CD and dotted lines (41) and (42) respectively represent the acceptable upper (CD+) and lower (CD−) values, which vary from the target CD (40). The defocusing parameter (X-axis) denotes a relative deviation from a best focus position. In FIG. 4A, the best focus position is depicted as defocusing=0.

A lithographic process will be deemed robust if large variations in focus and dose minimally impacts the target CD (40) (maintaining the printed CDs within a desired range of acceptable CDs). In particular, a usable process window can be specified as the combination of DOF (depth of focus) and exposure latitude (LE) that maintains printed features within +/−10% of a target CD. The term exposure latitude (EL) denotes a percentage dose range of exposure energies (usually expressed as a percent variation from the nominal) that keeps the CD within specified limits. The usable focus range or depth of focus (DOF) typically refers to the range of focus settings wherein the lateral dimension of the printed feature or the space between features lies within a specification which is typically +/−10% of a targeted line width or CD. The concept of DOF is schematically illustrated in FIG. 4B.

In particular, FIG. 4B illustrates a lithographic projection process using a reticle to expose a photoresist coated substrate. In particular, FIG. 4B is a high-level schematic illustration of a projection system comprising a light source (43), a condenser lens (44), reticle (45) and projection lens (46). The light source (43) emits light which is incident on the condensing lens (44). The light passes through condensing lens (44) and evenly irradiates the entire surface of reticle (45) on which a predetermined pattern is formed. Thereafter, light passing through the reticle (45) is reduced by a predetermined scale factor via the projection lens (46) and exposes a photoresist layer (47) on semiconductor substrate (48). By using the projection optics (46), the size of mask features on the reticle (45) are typically 4 or 5 times larger than the same feature which is printed in the photoresist (47). For example, a mask line feature with a 1 micron width on the reticle would translate to a 0.2 micron wide line printed in the photoresist in a 5× reduction projection system.

FIG. 4B conceptually illustrates DOF. In general, the focal plane of the optical system is the plane which contains the focal point FP. The focal plane is typically referred to as the plane of best focus of the optical system The term focus refers to the position of the plane of best focus of the optical system relative to a reference plane, such as the top surface of the resist layer or the center of the photoresist, as measured along the optical axis (i.e., perpendicular to the plane of best focus). For instance, as depicted in FIG. 4B, the plane of best focus (focal plane) is placed near the surface of the photoresist layer (47). In the exemplary embodiment of FIG. 4B, focus is set by the position of the surface of the resist layer (47) relative to the focal plane of the imaging system. The term defocus refers to the distance, measured along the optical axis (i.e., perpendicular to the plane of best focus) between the actual position of the reference plane of the resist-coated wafer (e.g., the surface of the resist layer (47)) and the position if the wafer were at best focus. During a photolithographic process, the focus can change from the best focus to +/− defocus position. The DOF refers to the acceptable range of +/− defocus.

Referring again to FIG. 4A, variations in focus and exposure dose can lead to an increase or decrease of the CDs of printed features (from the target CD) outside the acceptable range of CDs. In general, a narrow process window will be realized if the line width drastically changes as a function of focus change. For example, as depicted in FIG. 4A, the parametric curves E1, E2, E4 and E5 illustrate that for the corresponding exposure doses, CD is more sensitive to deviations in focus from the best focus position (defocus=0). In contrast, the curve E3 is more linear, which indicates that for the given exposure dose, CD is less sensitive to deviations in focus from the best focus position (defocus=0).

Although enhancement techniques such as AAPSM and EAPSM discussed above can be utilized to improve resolution, such techniques can be complex, costly and can require increased chip size. Moreover, PSM technology is subject to the "forbidden pitch" phenomenon, resulting in reduced process windows. More specifically, with off-axis illumination, for a given feature and target CD, there can be one or more pitches where the process latitude of a dense pattern of such feature may be worse than that of an isolated feature of the same size. When the off-axis illumination is optimized for a given pitch (e.g. the smallest pitch on the mask), there may be pattern having a pitch where the angle of the illumination together with the angle of diffraction results in diffraction that yields a reduced DOF for that pitch. The forbidden pitch phenomenon has become a limiting factor in advanced photolithography for printing sub-wavelength features.

Exposure tools have a "focus budget" which refers a minimum DOF requirement of a photolithography process that is required to cover focus variations of the exposure tool. If the DOF of a given layout pattern pitch is not greater than the focus budget required by the exposure tool, the layout pattern pitch is considered a forbidden pitch. As such, the ability to mitigate the forbidden pitch phenomenon will generally improve the CDs and process latitude obtainable utilizing current semiconductor device manufacturing tools and techniques.

When printing sub-wavelength features, it is important to control CD uniformity. However, minor variations in parameters of the exposure process on photolithographic exposure equipment (scanners/steppers), may cause the critical dimensions (CD) of printed features to fall outside an acceptable manufacturing tolerances. For example, the DOF is generally viewed as one of the most critical factors in determining the resolution of the lithographic projection apparatus. During a photolithographic process, the focal point of the exposure system can drift above or below the desired reference surface of the photoresist coated substrate due to, e.g., temperature or pressure drifts, wafer flatness variations or other factors. Depending on the process widow, the amount of focus shift (or defocus) from best focus can have a dramatic effect on the size of the printed feature. As such, it is highly desirable to be able to control the process such that the focus is kept within a usable range for each wafer. In this regard, the amount of defocus cannot be determined without an adequate method of measuring best focus.

In view of the above, it would be highly desirable to develop mask techniques and OPC solutions to improve lithographic process windows and increase the resolution of current optical exposure systems for precision printing sub-wavelength features. Moreover, given the sensitivity of CD variation with regard to focus drifts in sub-wavelength lithography processes, it would be highly desirable to develop techniques for efficiently detecting focal point drifts (magnitude and direction) during a photolithographic process and enable automated control of an exposure tool to adjust focal point and achieve CD uniformity.

SUMMARY OF THE INVENTION

In general, exemplary embodiments of the invention include systems and methods for detecting focus drifts in a photolithographic process. More specifically, exemplary embodiments of the invention include methods for constructing photomasks with test patterns adapted to print test features with critical dimensions that can be measured and analyzed to determine magnitude and direction of defocus from a best focus position of an exposure tool during a lithographic process.

In one exemplary embodiment of the invention, a method is provided for monitoring focus of a lithographic process. The method includes obtaining a semiconductor wafer having a photoresist pattern formed thereon, the photoresist pattern including a printed test pattern comprising first and second printed test features, determining a printed critical dimension CD1 of the first printed test feature and a printed critical dimension CD2 of the second printed test feature, determining a relative CD difference between the printed critical dimensions CD2 and CD1, and then determining a magnitude and direction of defocus from a best focus setting for the lithographic process based on the determined relative CD difference.

In one embodiment, the printed test pattern is formed such that a linear relationship exists between an amount of defocus and the relative CD difference. The focus setting is deemed to be at the best focus setting when the relative CD difference is determined to be about 0. A lithographic process model is constructed, which quantifies the linear relationship between defocus and relative CD difference using corresponding focus-exposure matrix data.

In another exemplary embodiment of the invention, a photomask includes a circuit layout pattern, and a test pattern comprising first and second test features. The first and second test features are formed having at least one feature size equal to a design CD. The test pattern is adapted to create a first printed test feature with a printed critical dimension CD1 and a second printed test feature with a printed critical dimension CD2 such that a relative difference between the printed critical dimensions CD2 and CD1 correlates to a magnitude and direction of defocus from a best focus setting for the lithographic process. The first and second printed test features are formed to have through-focus CD properties which yield respective first and second focus-exposure curves that are shifted in equal and opposite directions with respect to a best focus position and which are substantially mirror images over the best focus position.

In one embodiment, the first and second printed test features are elongated bar elements separated by a pitch P, and wherein the printed critical dimensions CD1 and CD2 are respective widths of the printed bar features. The first and second printed test features are formed by transferring the first and second test features to a substrate. The first and second test features are formed of a first elongated bar element and a second elongated bar element separated by a pitch P, wherein the first and second elongated bar elements have line widths equal to the design CD. The first elongated bar element comprises a first inner non-printing feature adapted to provide substantially 100% transmittance of about 90 degree phase shifted light, and the second elongated bar element comprises a second inner non-printing feature adapted to provide substantially 100% transmittance of 270 degree phase-shifted light.

In one exemplary embodiment, the first and second non-printing features each comprise a space feature that exposes a region of the mask substrate aligned to inner regions of the first and second test features, and a trench feature formed in the mask substrate and aligned to the space feature.

In another exemplary embodiment of the invention, a photolithography system includes an exposure system to expose a photoresist coated wafer with light through a photomask having a mask pattern including a circuit layout pattern and a test pattern, wherein the test pattern comprises first and second test features having at least one feature size equal to a design CD, wherein the test pattern is adapted to create a first printed test feature with a printed critical dimension CD1 and a second printed test feature with a printed critical dimension CD2. The system further includes a focal point monitoring system that detects focus drift of the exposure system, wherein the focal point monitoring system processes measured CD data of the first and second printed tests features to determine a magnitude and direction of focus drift based on a CD difference between CD2 and CD1.

In another embodiment, the system comprises a control system that automatically adjusts a focus setting of the exposure system in response to a control signal output from the focal point monitoring system. In yet another embodiment, the system comprises a CD measurement system that automatically measures CD2 and CD1 of the respective printed test features and outputs the measured CD2 and CD1 to the focal point monitoring system for analysis.

In yet another embodiment of the invention, the system comprises a repository of lithographic process parameters models and FEM (focus-exposure matrix) data. The lithographic process models quantify a linear relationship between defocus and relative CD difference between CD2 and CD1 using corresponding FEM data. The lithographic process models specify through-focus CD properties of the first and second test features which yield respective first and second focus-exposure curves that are shifted in equal and opposite directions with respect to a best focus position and which are substantially mirror images over the best focus position.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 1A:
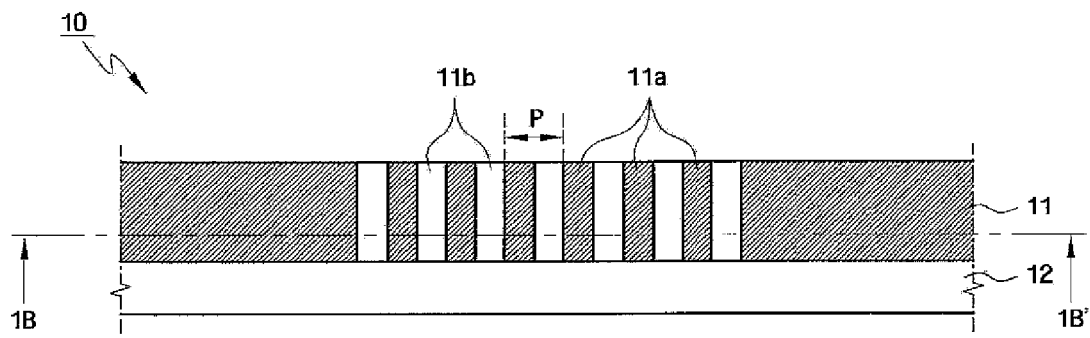
FIGS. 1A, 1B and 1C schematically illustrate a conventional photolithography process using a binary mask structure.
Figure 1B:
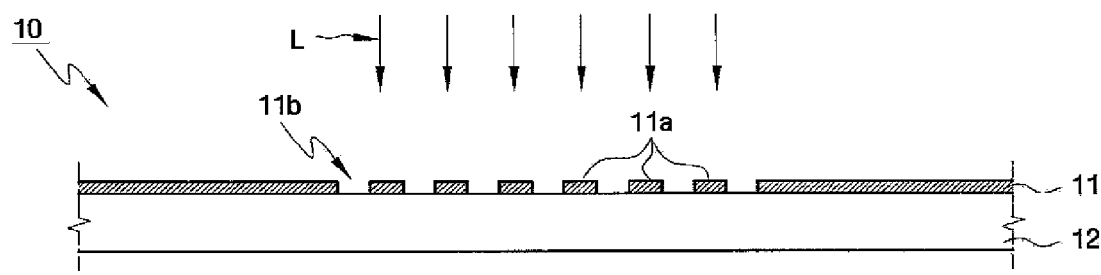
Figure 1C:
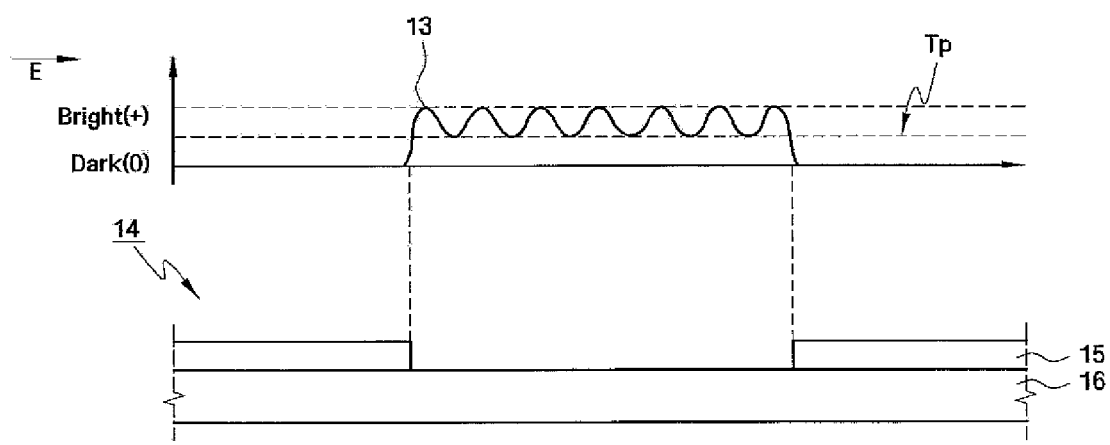
Figure 2A:
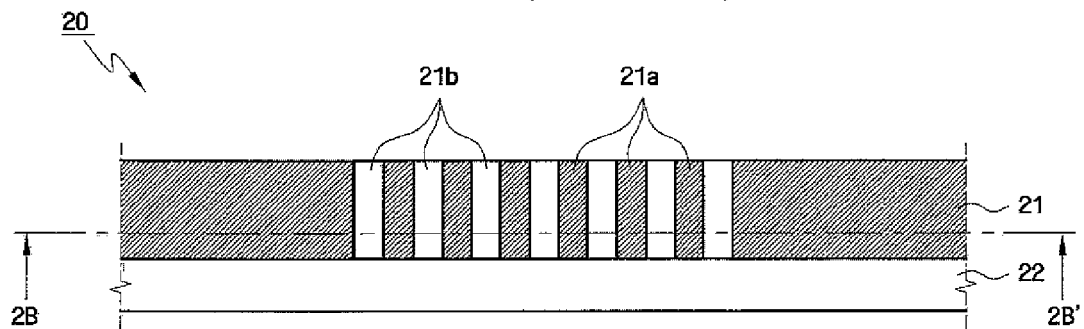
FIGS. 2A, 2B and 2C schematically illustrate a conventional photolithography process using an EAPSM (Embedded Attenuated Phase Shift Mask).
Figure 2B:
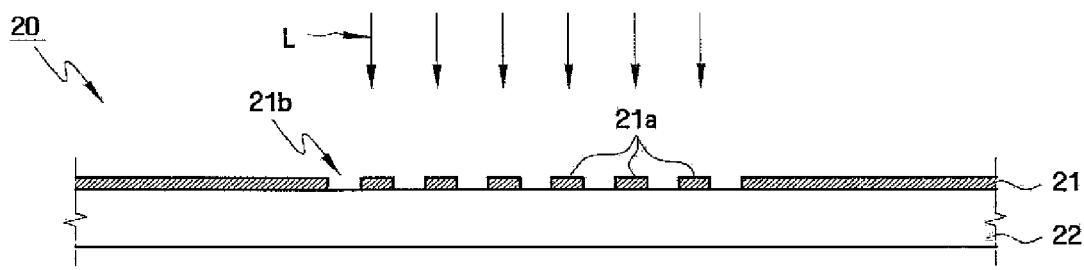
Figure 2C:
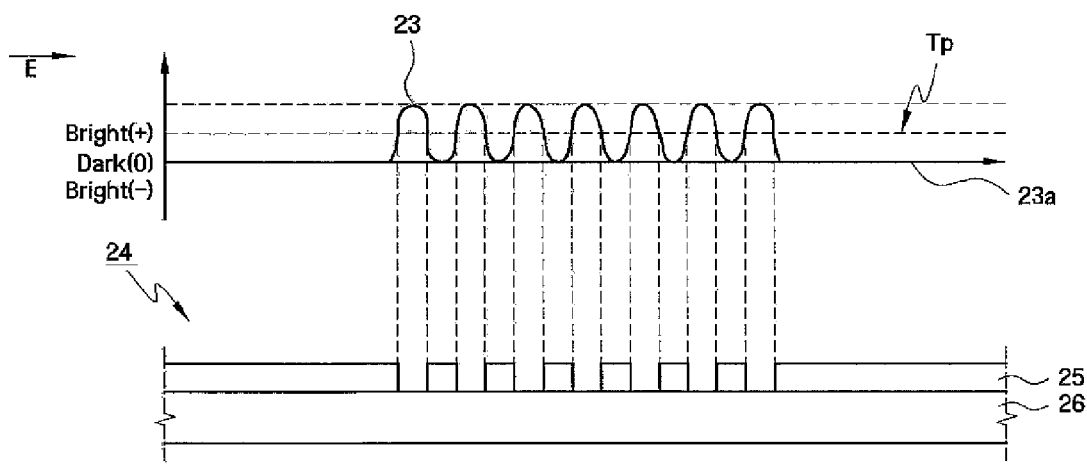
Figure 3A:
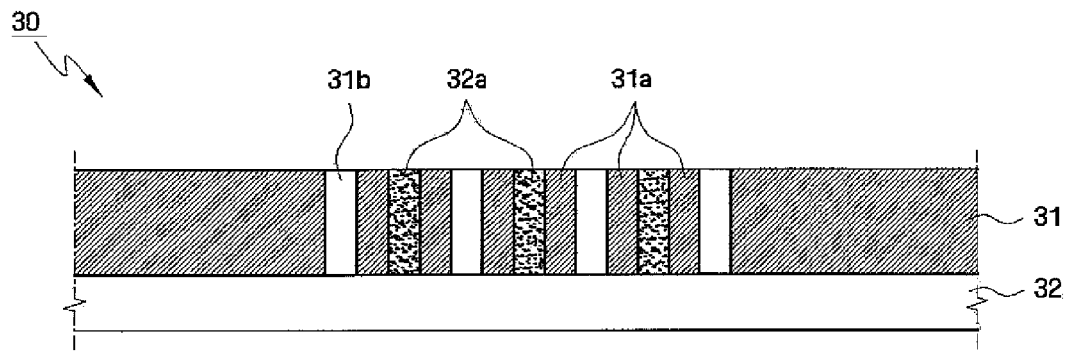
FIGS. 3A, 3B and 3C schematically illustrate a conventional photolithography process using an AAPSM (Alternating Aperture Phase Shift Mask).
Figure 3B:
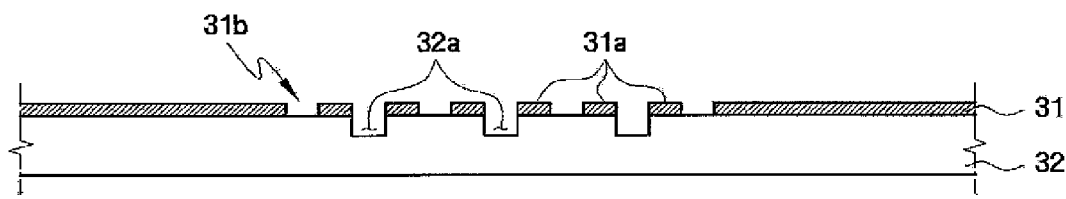
Figure 3C:
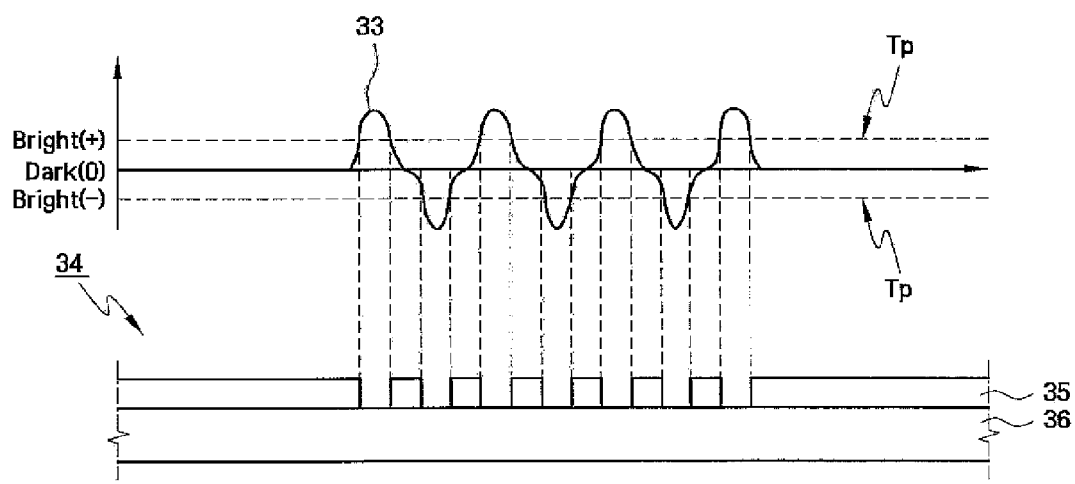
Figure 4A:
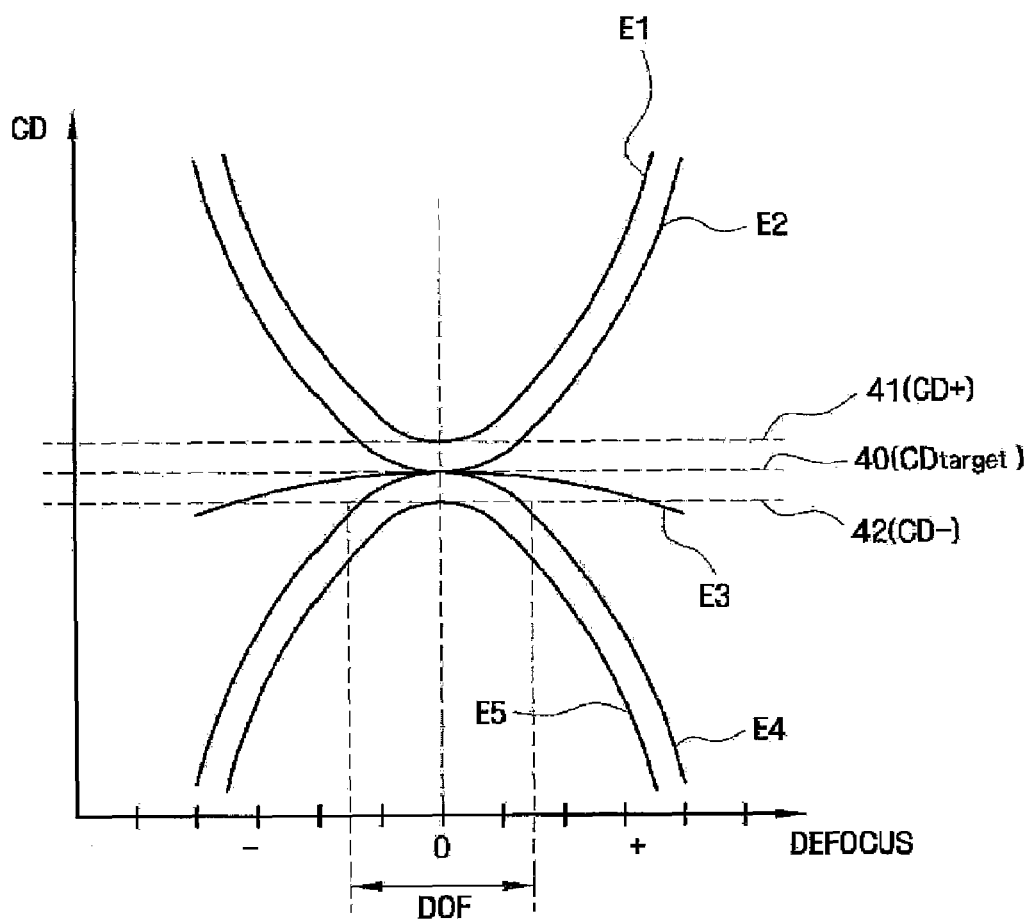
FIG. 4A is an exemplary Bossung (focus-exposure) plot which includes parametric curves of line width (CD) versus focus with exposure dose as a parameters FIG. 4B schematically illustrates a lithographic projection process using a reticle to expose a photoresist coated substrate.
Figure 4B:
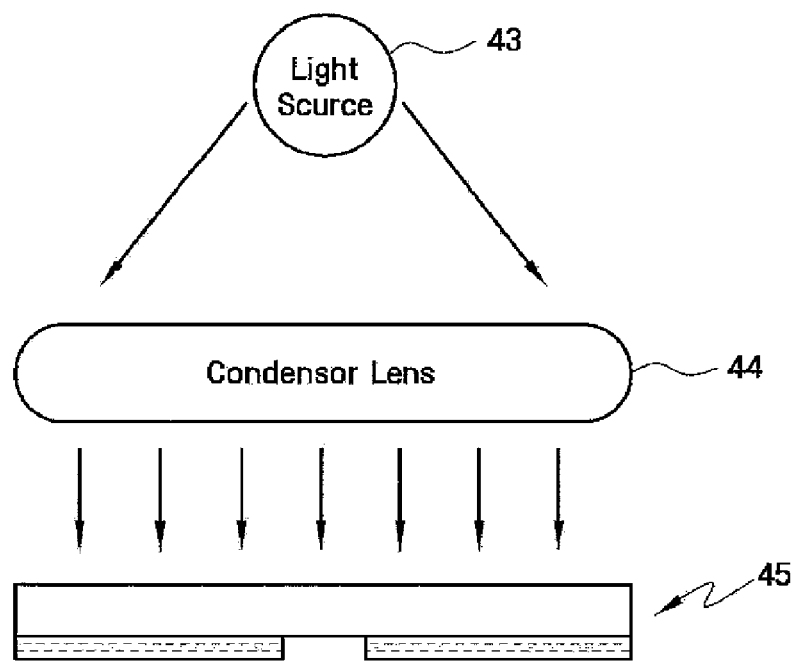
Figure 4B:
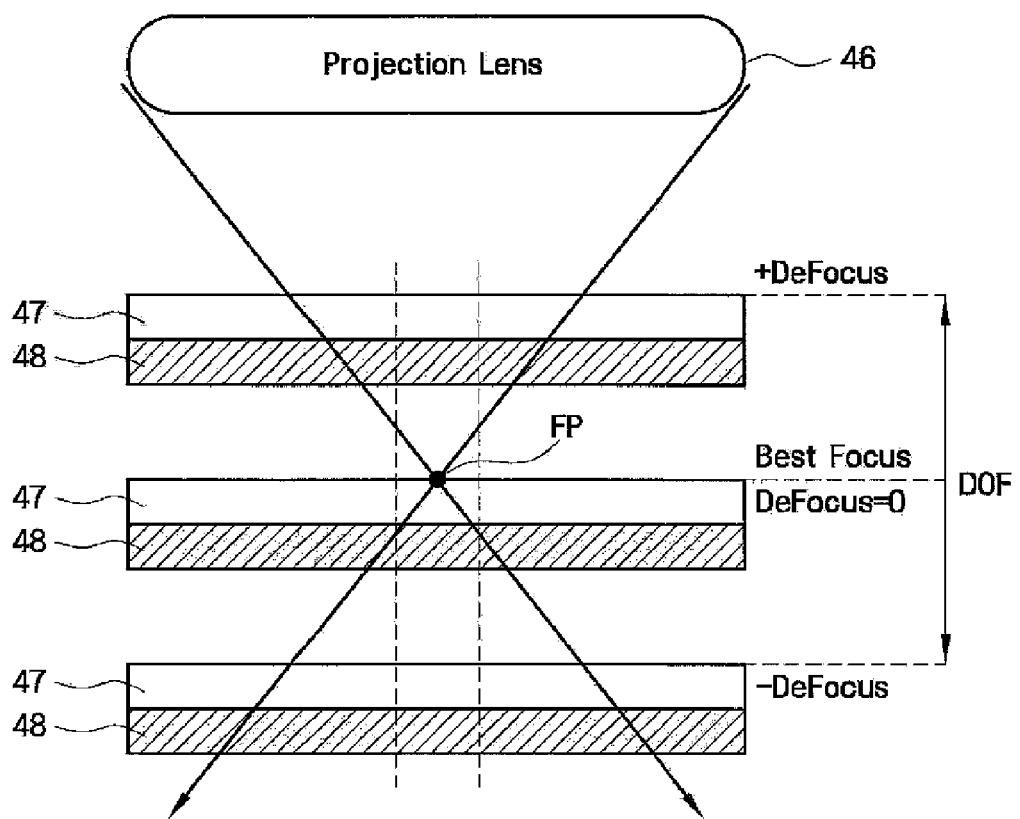

Exemplary photomask structures and methods for using photomask structures for improving lithographic process windows and enable focal point detection for fabricating such devices according to exemplary embodiments of the invention will now be described more fully with reference to the accompanying drawings. It is to be understood that the drawings are merely schematic depictions where the thickness and dimensions of various elements, layers and regions are not to scale, but rather exaggerated for purposes of clarity. It is to be further understood that when a layer is described herein as being "on" or "over" another layer or substrate, such layer may be directly on the other layer or substrate, or intervening layers may also be present. It is to be further understood that the same reference numerals used throughout the drawings denote elements that are the same or similar or have the same or similar functions.

Figure 5A:
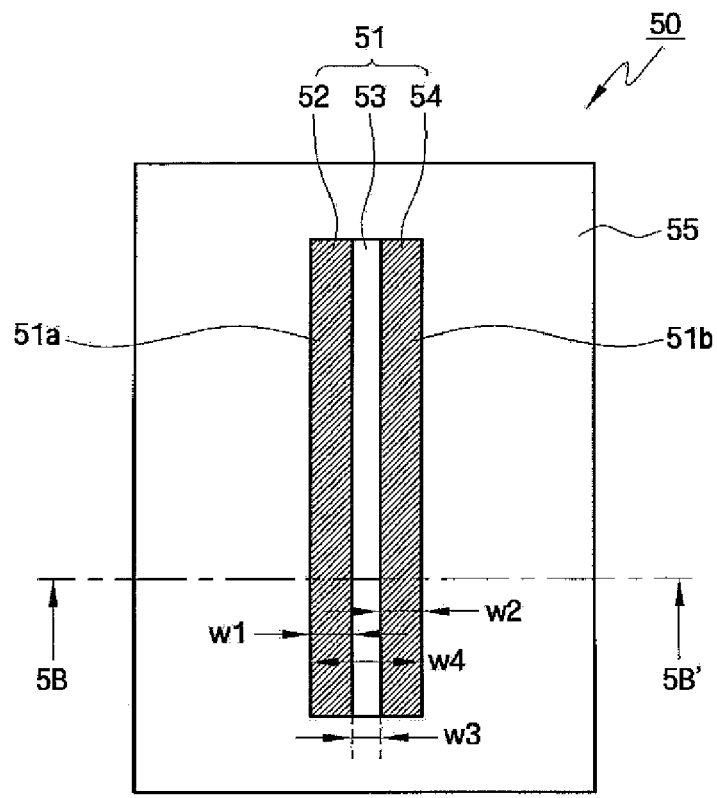
FIGS. 5A and 5B schematically illustrate a photomask structure according to an exemplary embodiment of the invention.
Figure 5B:
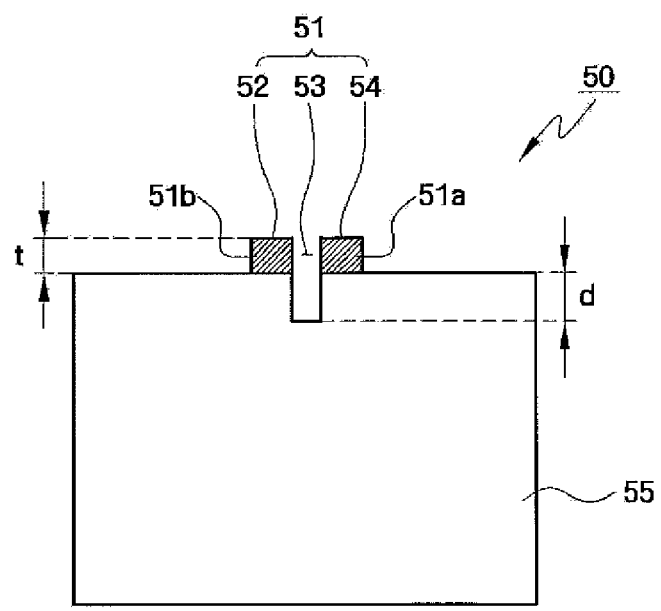

FIGS. 5A and 5B schematically illustrate a photomask according to an exemplary embodiment of the invention. In particular, FIG. 5A is a top plan view of an exemplary photomask (50) and FIG. 5B is a cross-sectional view of the exemplary photomask (50) along line 5B-5B in FIG. 5A. In general, the photomask (50) comprises a mask pattern formed on a mask substrate (55). The mask pattern includes an elongated bar element (51) according to an exemplary embodiment of the invention. The elongated bar element (51) is a printable feature having a thickness t and width W4 between critical edges (51a) and (51b). The elongated bar element (51) comprises an elongated first light blocking element (52) of width W1, an elongated second light blocking element (54) of width W2, and an inner phase shifting feature (53) (or what is referred to herein as "phase bar") disposed between the first and second light blocking elements (52) and (54). The phase bar (53) is an inner region of width W3 which extends into the mask substrate (55) to a depth d below the surface of the mask substrate (55).

In general, the phase bar (53) is a non-printing, resolution enhancing feature that can be implemented with various mask technologies to improve the process window for printing sub-wavelength features. The phase bar (53) is formed to have sub-resolution dimensions (e.g., width W3 is smaller than the design CD) such that the phase bar (53) is not printed. Essentially, the phase bar (53) is an inner light transmitting region of the elongated bar element (51) which provides 100% transmittance of light, which is phase-shifted relative to the light transmitted through the exposed light transmitting regions of the substrate (55) surrounding the bar element (51). The amount of phase-shift depends on the trench depth d of the phase bar (53), the mask substrate (55) material and the light source wavelength. In one exemplary embodiment, the phase bar (53) is designed to transmit light in a 180 degree phase shift from light transmitted in the surrounding light transmitting regions. In particular, to provide a 180 phase-shift, the depth d of the trench will be determined as follows: $d \cdot (\eta_{substrate} - \eta_{air}) = \frac{1}{2}\lambda$. The resulting phase difference leads to interference, which improves image contrast.

Furthermore, the overall transmittance of the bar element (51) can be controlled by varying the dimensions of the constituent elements (52, 53, 54) (e.g., widths W1, W2 and W3) and/or the type of material used to form the light blocking elements (52) and (54). In particular, the bar element (51) comprises 3 bars which collectively function as a single bar element having an effective transmittance:

$$\frac{((W_1 \cdot T_1) + (W_2 \cdot T_2) + (W_3 \cdot T_3))}{W_4},$$

wherein T1, T2 and T3 denote the % transmittance of the first light blocking bar (52), the second light blocking bar (53) and the phase bar (53), respectively. As noted above, the phase bar (53) provides 100% transmittance. The transmittances T1 and T2 of the light blocking elements (52) and (54) will vary depending on the material. For example, a light blocking material, such as chromium, having substantially 0% transmittance can be used, or a light blocking material, such as MoSi, having low % transmittance of about 5-10%, can be used. In effect, the light blocking elements (52) and (52) are structured and dimension to control the percentage of light transmission and the distribution of light intensity between the outer light transmission regions and the inner light transmitting (phase bar) region to optimize the image contrast. This is to be contrasted with conventional photomask techniques, where the transmittance of the bars cannot be modified.

Figure 5C:
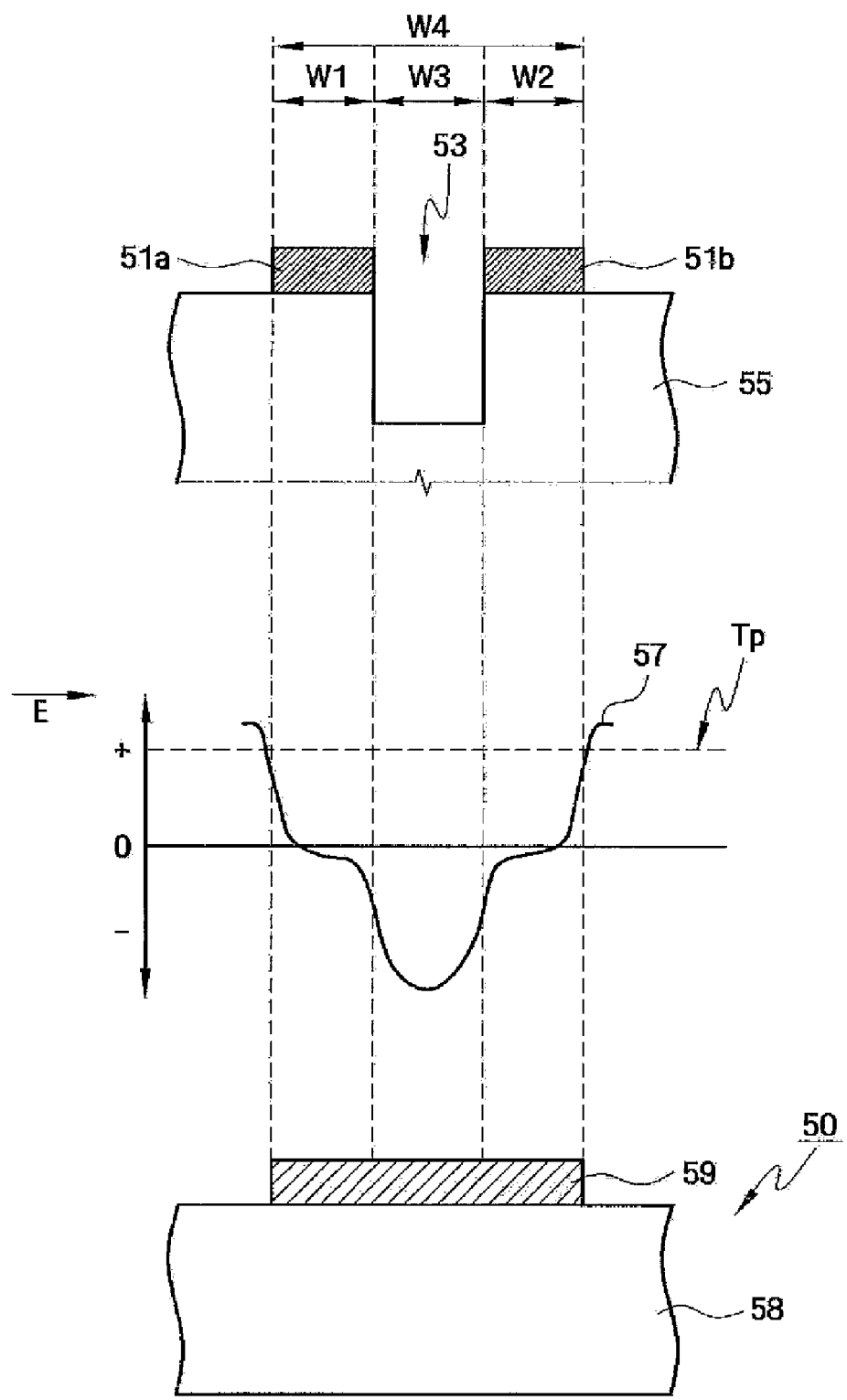
FIG. 5C schematically illustrates a photolithograph process using the exemplary photomask of FIGS. 5A and 5B.

The various elements (52, 53 and 54) of the bar element (51) can be designed to distribute the light intensity across the photoresist surface in a manner that optimally enhances the optical contrast at the feature critical edges (51a) and (51b) thereby improving the resolution and process window for printing the bar element (51). For example, FIG. 5C schematically illustrates a photolithograph process using the exemplary photomask (50). FIG. 5C depicts an electric field curve (57) at the wafer level along a photoresist layer on a substrate (58), which results by exposing a positive resist coated substrate (58) using the exemplary photomask (50). In the example, it is assumed that the bar element (51) is formed of a light blocking material (or phase-shift material), such as molybdenum silicide (MoSi), having a transmittance in a range of 2-10%, at the given wavelength and that the depth d of the trench element of the phase bar (53) provide 180 degree phase shift. FIG. 5C depicts the resulting printed resist pattern (59) of width W4 which corresponds to the elongated bar element (51). The inner phase shifting region (53) allows 100% transmission of 180 degree shifted light, but is not printed in the resist feature (59).

Figure 6A:
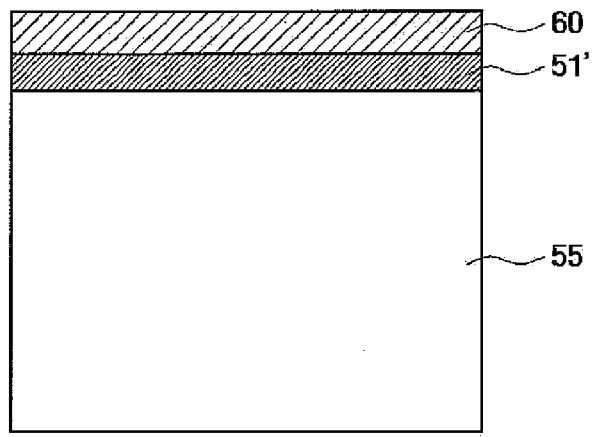
FIGS. 6A~6F schematically illustrate a method for constructing a photomask structure according to an exemplary embodiment of the invention.
Figure 6B:
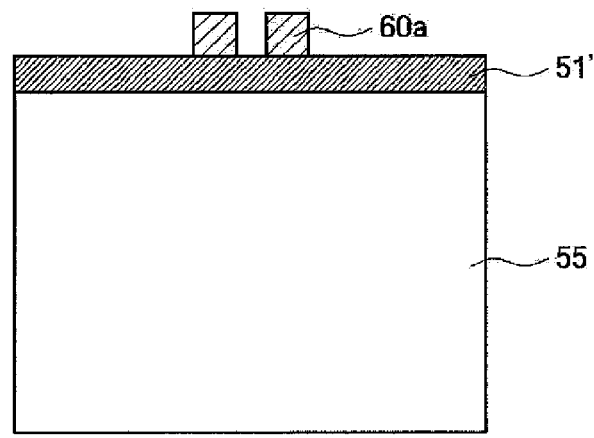

FIGS. 6A–6F schematically illustrate a method for constructing a photomask according to an exemplary embodiment of the invention. In particular, for illustrative purposes, FIGS. 6A–6F schematically depict a method for constructing the exemplary photomask (50) of FIGS. 5A and 5B. Referring initially to FIG. 6A, a mask material layer (51') and photoresist layer (60) are sequentially formed on mask substrate (55). The photoresist layer (60) is processed to form a resist pattern (60a) as depicted in FIG. 6B. In one exemplary embodiment, the photoresist pattern (60a) is formed using a laser exposure process to expose desired regions of the photoresist layer (60) according to a predetermined mask layout design, followed by a develop process to remove the laser exposed regions of the photoresist (60).

Figure 6C:
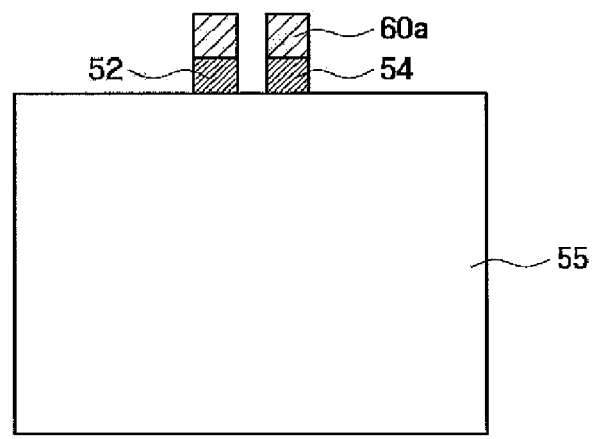
Figure 6D:
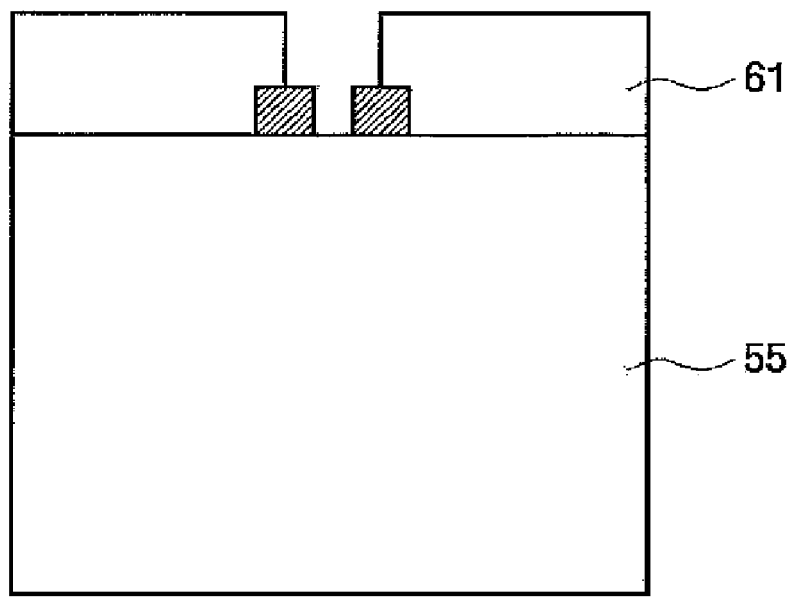
Figure 6E:
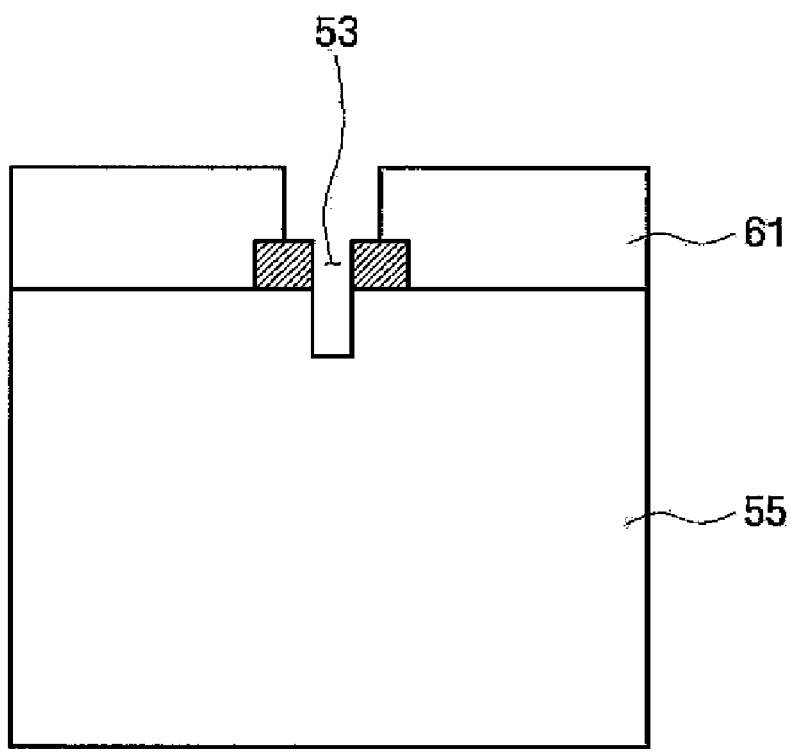
Figure 6F:
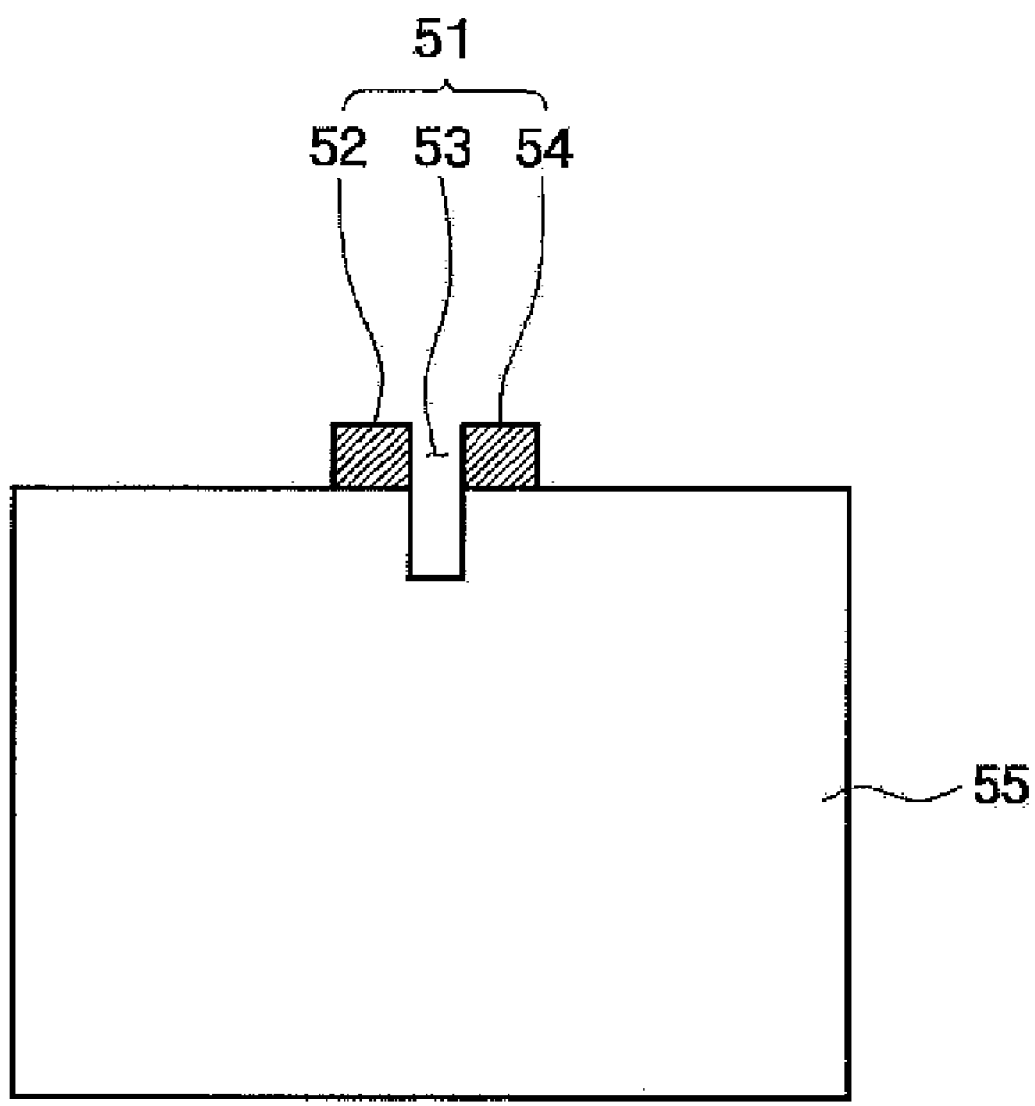

Referring to FIG. 6C, the photoresist pattern (60a) is used as an etch mask for etching the mask material layer (51') using known techniques to pattern the layer (51') and generate the photomask pattern. For example, as depicted in FIG. 6C, the light blocking elements (52) and (54) for the elongated bar element (51) are formed during the first etch process. Referring to FIG. 6D, a second photoresist pattern (61) is formed to expose the space region between the light blocking elements (52) and (54). In FIG. 6E, an etch process is performed using the photoresist pattern (61) as an etch mask to etch a trench into the mask substrate (55) to a desired depth d. In FIG. 6F, the photoresist mask (61) is then removed, resulting in the photomask structure as discussed above with reference to FIGS. 5A/B.

In the exemplary method of FIGS. 6A–6F, only two mask writing steps are performed to form the mask pattern (51). The first mask writing process (FIGS. 6A/6B) which entails forming the mask patterns (51) and defining the phase edges, is a critical process that can be accurately performed using a laser process. The second mask writing process (FIGS. 5D/5E), which entails etching phase bar trenches into the mask substrate (55), is less critical. In particular, the second mask writing process does not require precision overlay of the photoresist mask (61) due to the fact that the trenches are self-aligned by the light blocking elements (52) and (54). In particular, the photoresist mask (61) operates to mask the other regions of the mask substrate (55) from being etched while the light blocking elements (52) and 54) essentially serve as an etch mask when etching trenches in the substrate (55).

Figure 7:
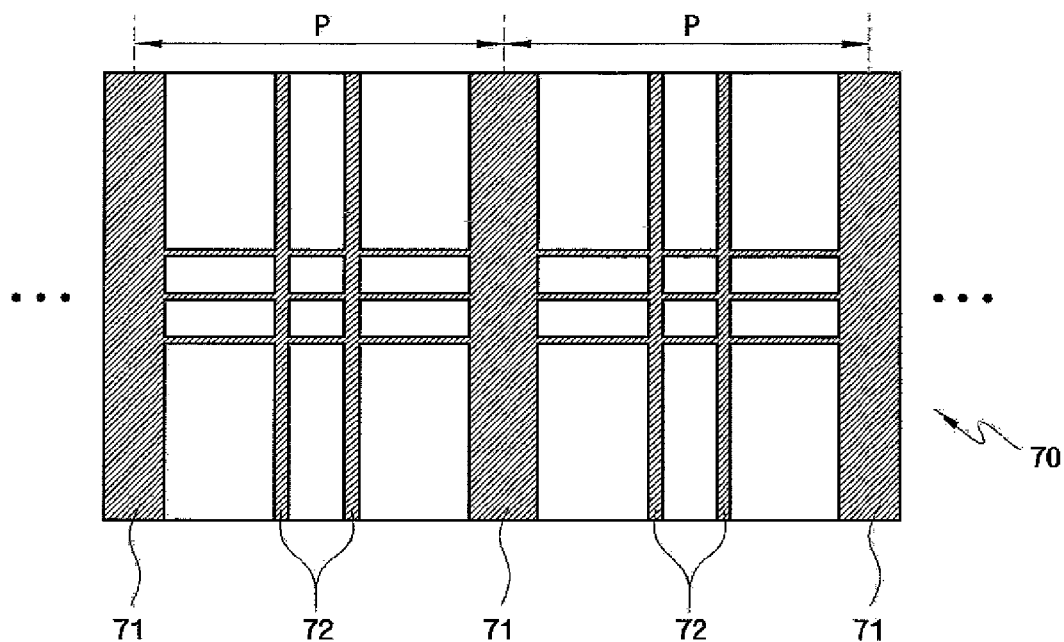
FIG. 7 illustrates a conventional photomask pattern.
Figure 8:
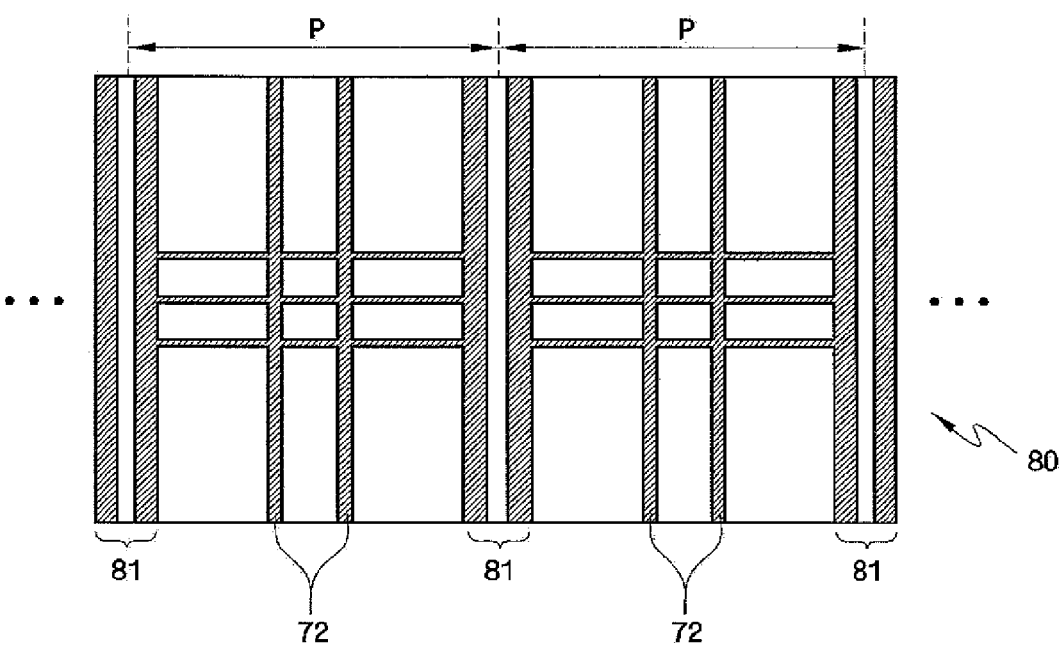
FIG. 8 illustrates a photomask pattern according to an exemplary embodiment of the invention.

To illustrate enhanced process windows that can be achieved using photomask structures with nonprinting inner phase shifting regions according to the invention, various simulations were performed for photomask patterns depicted in FIGS. 7 and 8. In particular, FIG. 7 illustrates a conventional photomask pattern (70) including a series of elongated bars (71) (printable features) arranged substantially parallel to one another and separated by pitch P. In addition, the pattern (70) includes a plurality of sub-resolution (non-printable) assist features (72) (or AF) arranged between the elongated bars (71). The assist features (72) are non-printable features that are provided in the mask to compensate for diffraction effects. FIG. 8 depicts a pattern similar to FIG. 7, but wherein the main bars (71) are replaced with exemplary bars (81) having phase bars, such as discussed above with reference to FIGS. 5A/5B.

Photolithographic simulations were performed using the mask patterns (70) and (80) for a target CD of 65 nm under the following conditions. The light source was defined as a generic DUV/ArF (193 nm)/4× with quasar illumination, NA=0.85. with exposure doses ranging from 0.53~0.80. The masks (70) and (80) were modeled as attenuated PSM masks with a mask material having 6.5 transmittance and a thickness providing 180 degrees phase shift. The pitch P was set at 600 nm, the width of the bars (71) and (81) were defined to be 105 nm, the width of the assist features (71) were defined to be 35 nm. In addition, for the exemplary bar elements (81) of FIG. 8, the widths of the light blocking elements and inner phase-shifting region were defined having equal widths—35 nm/35 nm/35 nm, and the trench depth was defined to provide phase shift of 180 degrees for the given light wavelength.

Figure 9A:
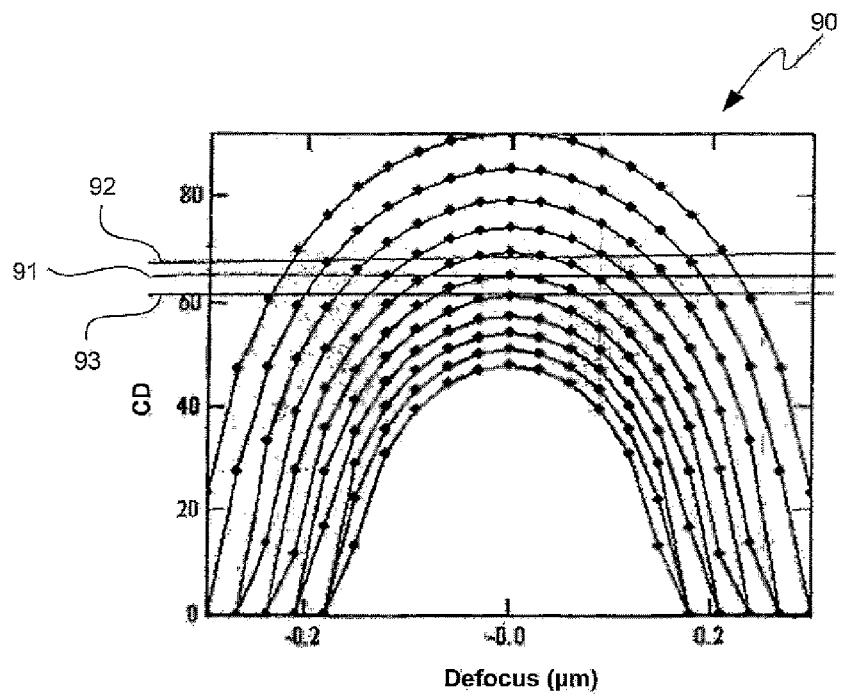
FIGS. 9A and 9B graphically depicts lithographic process windows obtained based on computer simulations performed with the photomask pattern of FIG. 7.
Figure 9B:
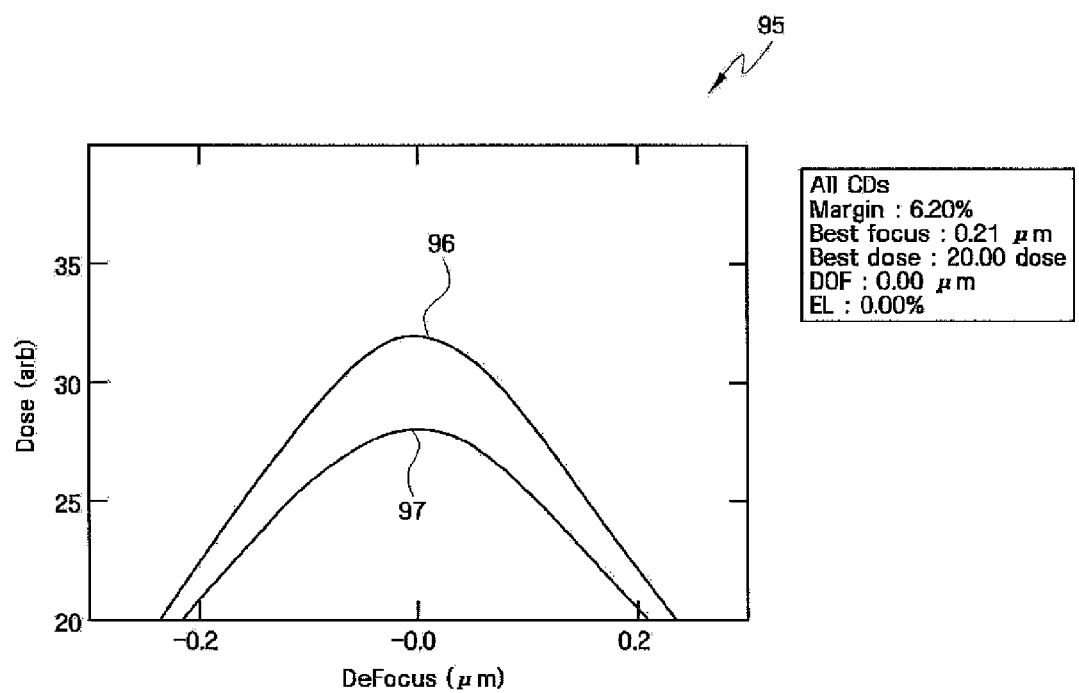

FIGS. 9A and 9B illustrate simulation results for the conventional mask pattern of FIG. 7 under the above described conditions. In particular, FIG. 9A depicts a Bossung graph (90) with curves for the exposure threshold varied from 0.53 to 0.80. The lines 91, 92 and 93 denote the target CD (65 nm), upper range value (CD+=69 nm) and lower CD value (CD−= 61 nm), providing a margin of about +/−6.2% for CD variation from the target CD. FIG. 9B graphically illustrates a process window (95) (CD process window), which includes curves (96) and (97) of the high and low CD specifications, respectively, as a function of exposure and focus. In the simulation for the exemplary pattern of FIG. 7, the best focus was determined to be −0.21 um and best dose was 20. Under these conditions, DOF and EL were equal to 0 (as such parameters fell outside the desired process window).

Figure 10A:
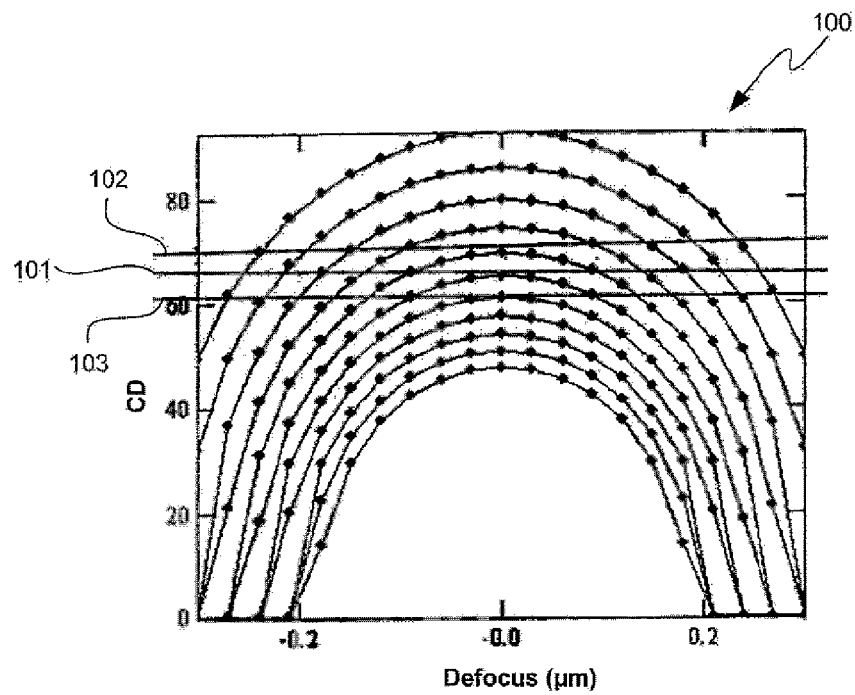
FIGS. 10A and 10B graphically depicts lithographic process windows obtained based on computer simulations performed with the photomask pattern of FIG. 8.
Figure 10B:
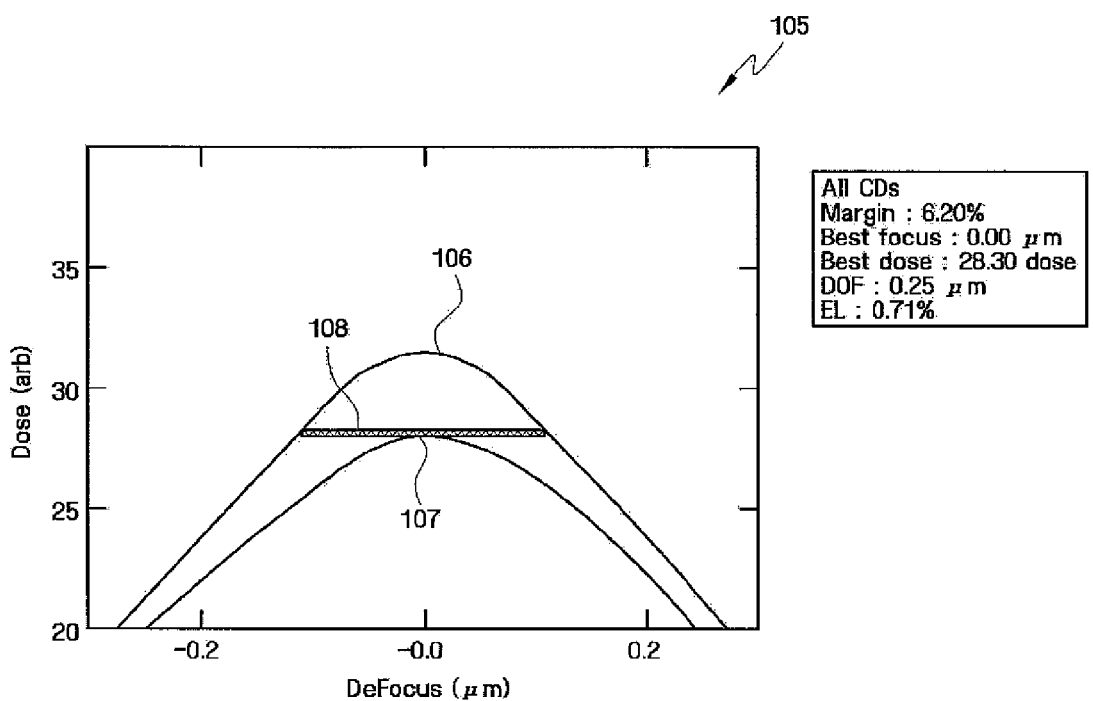

FIGS. 10A and 10B illustrate simulation results for the mask pattern of FIG. 8 under the above described conditions. In particular, FIG. 10A depicts a Bossung graph (100) with curves for the exposure threshold varied from 0.53 to 0.80. The lines 101, 102 and 103 denote the target CD (65 nm), upper range value (CD+=69 nm) and lower CD value (CD−= 61 nm), based on a margin of about +/−6.2% for CD variation from the target CD. FIG. 10B graphically illustrates a process window (105) (CD process window), which includes curves (106) and (107) of the high and low CD specifications, respectively, as a function of exposure and focus. In this simulation for the exemplary pattern of FIG. 8, the best focus was determined to be 0 um and best dose was 28.30. resulting in a usable process window (108) as shown in FIG. 10B. The process window (108) is relatively wide which demonstrates a significant defocus capability (DOF is 0.25 um). The process window (108) is relatively short in height, which demonstrates a relatively small exposure latitude capability (EL=0.71%).

Figure 11A:
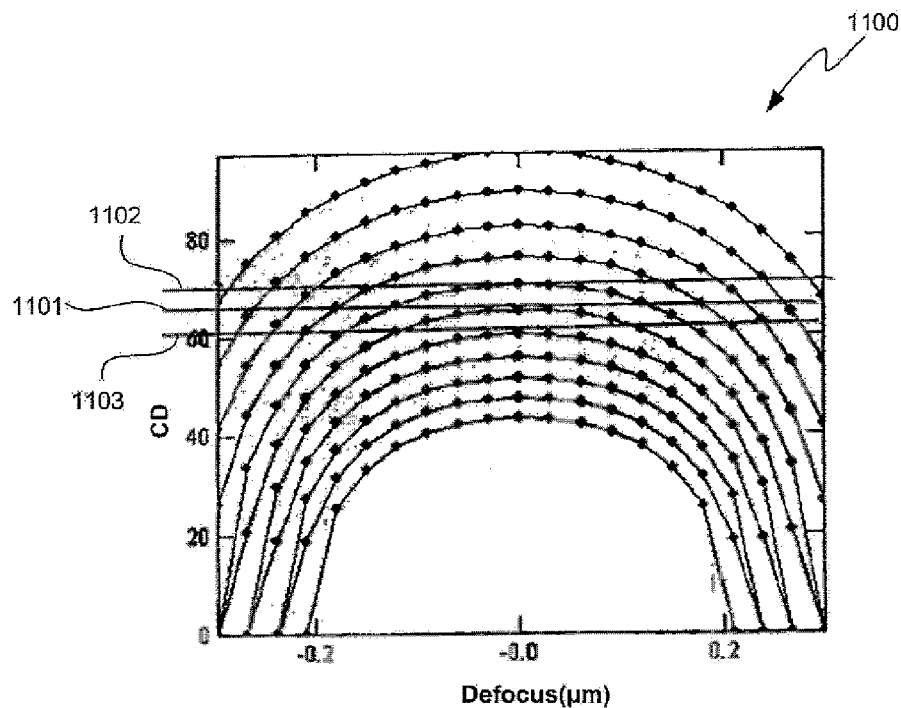
FIGS. 11A and 11B graphically depicts lithographic process windows obtained based on computer simulations performed with the photomask pattern of FIG. 8.
Figure 11B:
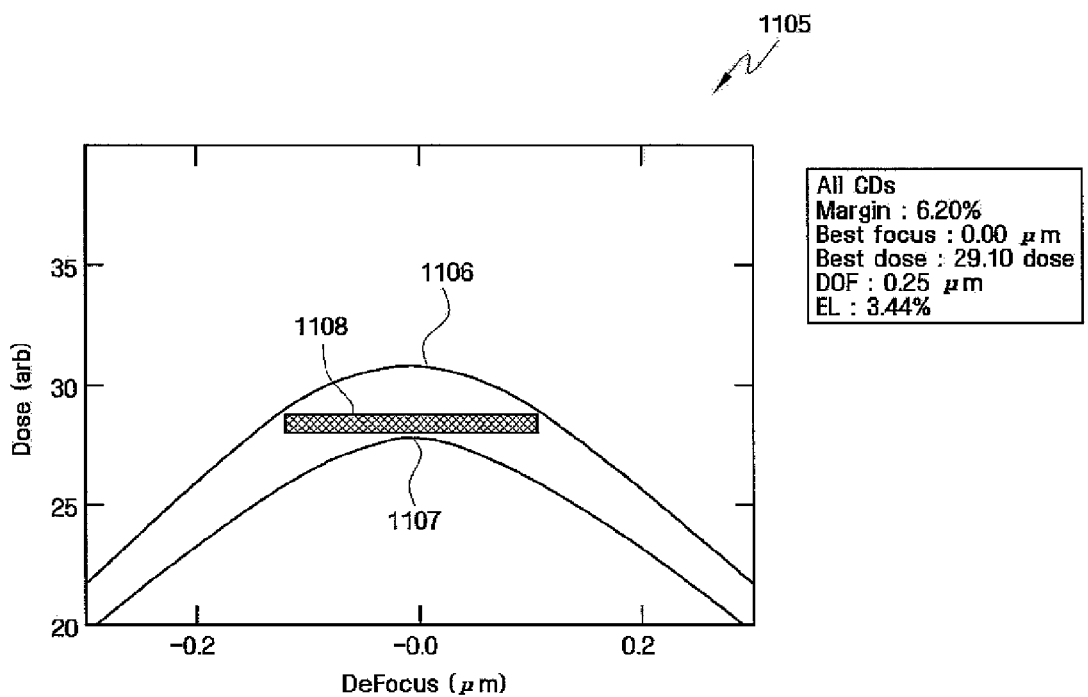

FIGS. 11A and 11B illustrate simulation results for the mask pattern of FIG. 8 under the above described conditions, except that the elongated bars (81) in FIG. 8 were modeled with the inner phase shifting regions having a width of 55 nm, and light blocking elements of equal width 25 nm (while maintaining the overall width at 105 nm as in the above simulations.). FIG. 11A depicts a Bossung graph (1100) with curves for the exposure threshold varied from 0.53 to 0.80. The lines 1101, 1102 and 1103 denote the target CD (65 nm), upper range value (CD+=69 nm) and lower CD value (CD−= 61 nm), based on a margin of about +/−6.2% for CD variation from the target CD. FIG. 11B graphically illustrates a process window (105) (CD process window), which includes curves (1106) and (1107) of the high and low CD specifications, respectively, as a function of exposure and focus. In this simulation for the exemplary pattern of FIG. 8, the best focus was determined to be 0 um and best dose was 29.10. resulting in a usable process window (1108) as shown in FIG. 11B. The process window (1108) is relatively wide which demonstrates a significant defocus capability (DOF=0.25 um). The process window (1108) has an increased height (as compared to FIG. 10B), which demonstrates an increased exposure latitude capability (EL=3.44%) as compare to that of FIG. 10B.

The Bossung curves of FIGS. 11A and 10A illustrate increased CD linearity as compared to the Bossung curves of FIG. 9A. Moreover, the Bossung curves of FIG. 11A illustrate increased CD linearity as compared to those of FIG. 10A. Overall, the simulation results indicate that increase process windows can be obtained for precise printing of sub-wavelength features using mask features that are design with non-printing inner phase shifting regions. It is to be understood that the exemplary bar features with inner phase bar features such as depicted in FIGS. 5A/5B are merely exemplary and that the inventive concepts of the invention may be readily applied to increase the process windows for printing other shapes and configurations of sub-wavelength features.

In other aspects of the invention, mask features with inner phase shifting regions are used to construct test patterns that enable magnitude and direction of focal point drifts to be efficiently detected during a photolithographic process and thus, allow focal point of the exposure system to be adjusted to yield CD uniformity. Indeed, in accordance with exemplary embodiments of the invention as explained below, automated control of an exposure process can be implemented in conjunction with focal point detection whereby the photoresist can be adjusted to the best image-forming plane, i.e. the best focus plane, of the projection optical system within a range of the depth of focus, such that photomask patterns can be transferred to photoresist layers with high resolution and precision. Exemplary methods are provided for detecting both magnitude and direction of variations in focus from the position of the best focus plane of a projection optical system.

Figure 12A:
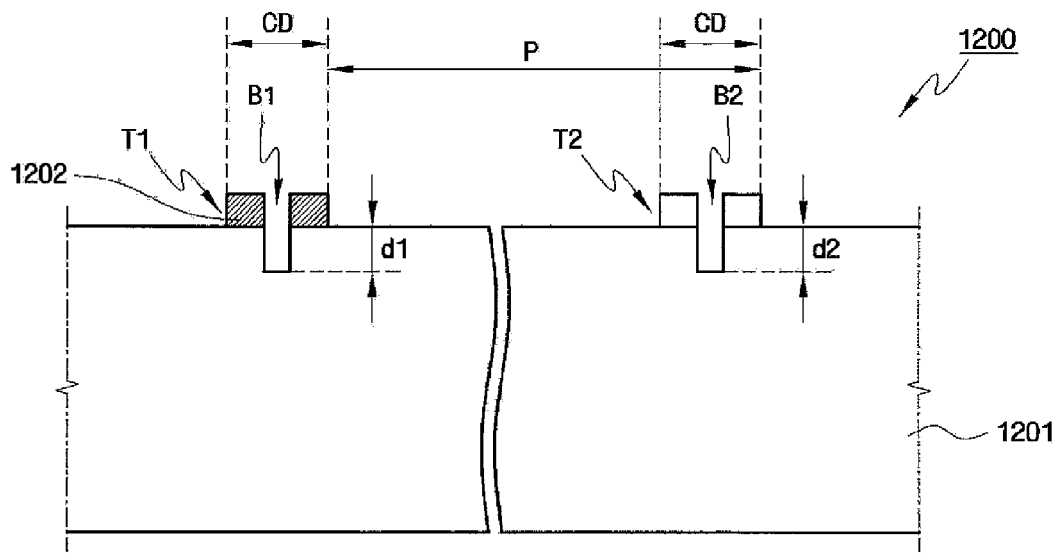
FIG. 12A schematically illustrate a photomask structure comprising a test pattern used for monitoring focal point variations according to an exemplary embodiment of the invention.
Figure 12B:
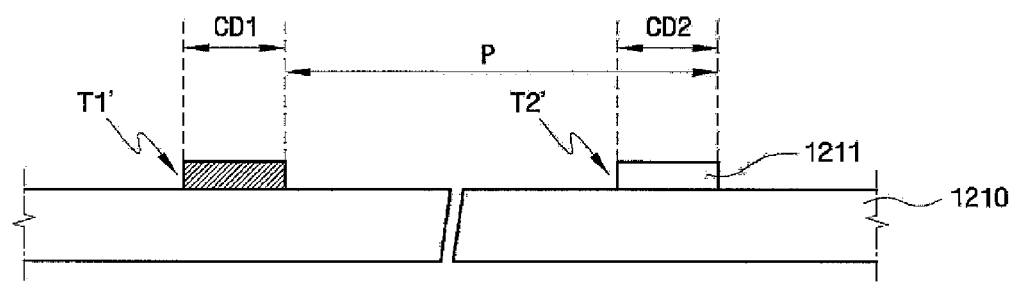
FIG. 12B schematically depicts a printed test pattern obtained by exposing a resist-coated wafer using the exemplary photomask structure of FIG. 12A.

FIGS. 12A and 12B schematically illustrate a focal point sensing method according to an exemplary embodiment of the invention. In particular, FIG. 12A depicts an exemplary photomask (1200) comprising a mask substrate (1201) and a mask test pattern (1202) according to an exemplary embodiment of the invention. The mask test pattern (1202) includes two test structures T1 and T2 separated by a pitch P. In general, the test structures T1 and T2 are elongated bar elements having respective inner phase shifting regions B1 and B2. The test structures are similar in structure to the elongated bar element described above with reference to FIG. 5, and can be constructed using the methods described with reference to FIG. 6. The test structures T1 and T2 are designed such a difference between the phase-shifts provided by the phase bars B1 and B2 is 180 degrees. For example, the first test structure T1 may be formed with a phase bar B1 designed to transmit light in a 90 degree phase shift from light transmitted in the surrounding light transmitting regions. In particular, to provide a 90 phase-shift, the depth d1 of the trench will be determined as $d_1 \cdot (\eta_{glass} - \eta_{air}) = \frac{1}{4}\lambda$. The second test structure T2 may be formed with a phase bar B2 designed to transmit light in a 270 degree phase shift from light transmitted in the surrounding light transmitting regions. In particular, to provide a 270 phase-shift, the depth d2 of the trench will be determined as $d_2 \cdot (\eta_{glass} - \eta_{air}) = \frac{3}{4}\lambda$. The test structures T1 and T2 are formed having the same with CD between the critical edges, wherein CD is selected to be equal to the smallest CD for the mask pattern. For CDs 1 micron or smaller, the pitch P is selected to be about 10× CD or greater.

The mask pattern of FIG. 12A is exposed to light to form a printed test pattern as shown on FIG. 12B. In particular, FIG. 12B schematically depicts a substrate (1210) having a photoresist pattern (1211) formed thereon. The photoresist pattern (1211) includes printed test pattern features T1' and T2' corresponding to the respective mask test pattern features T1 and T2 in FIG. 12A. The printed test feature T1' is shown having a width of CD1 and the printed test feature T2' is shown having a width of CD2. In FIG. 12A, the mask test features T1 and T2 are formed having the same width CD. In accordance with an exemplary embodiment of the invention, the difference in the widths (i.e., CD2–CD1) of the printed test features T1' and T2' formed by the same illumination can be measured and analyzed to readily detection variations in focus. In particular, as will be explained in detail below with reference to FIGS. 13A~13C, the difference CD2–CD1 is used to determine both magnitude and direction of focus drift, thereby allowing focus adjustment during a photolithography process.

Figure 13A:
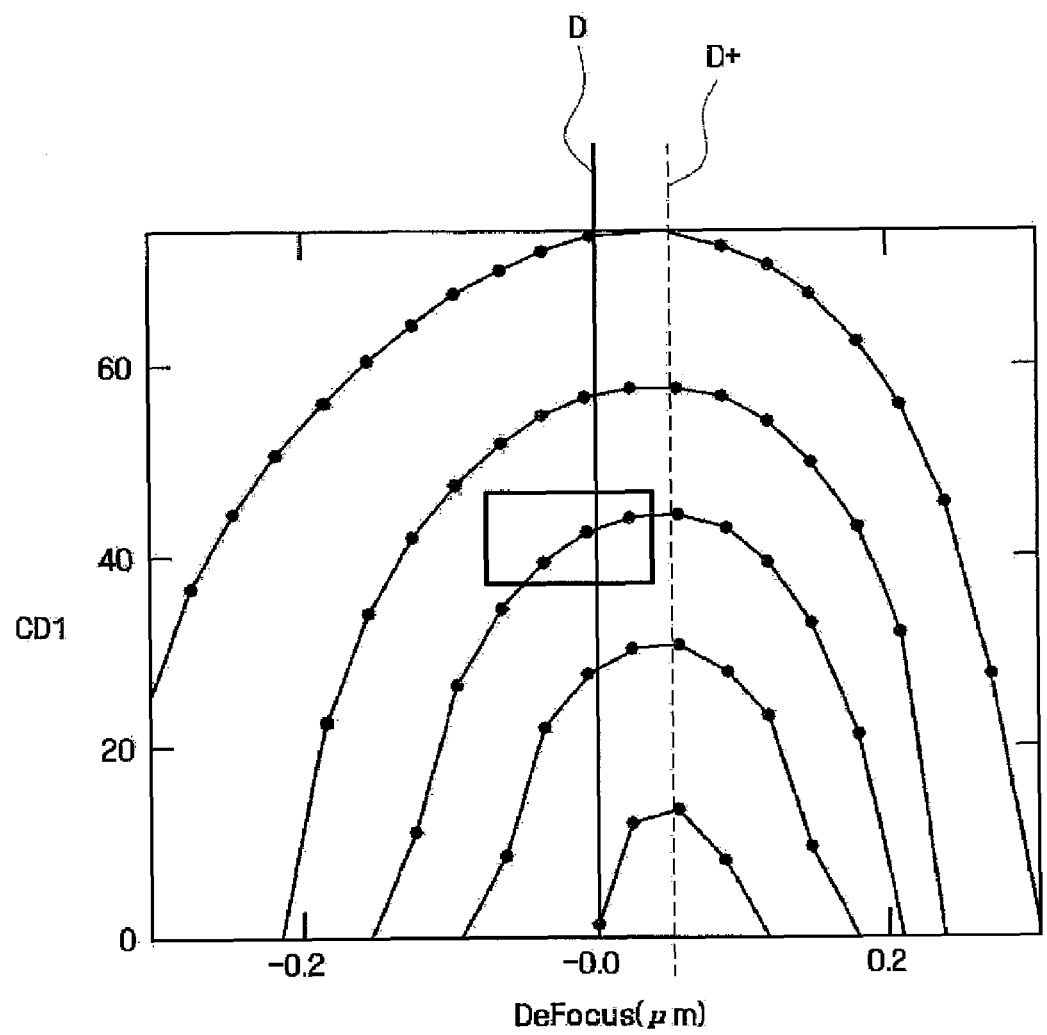
FIGS. 13A and 13B graphically illustrate focus-exposure matrices including processing parameters that are sued to correlate focus variations with measured CD values for target test pattern.
Figure 13B:
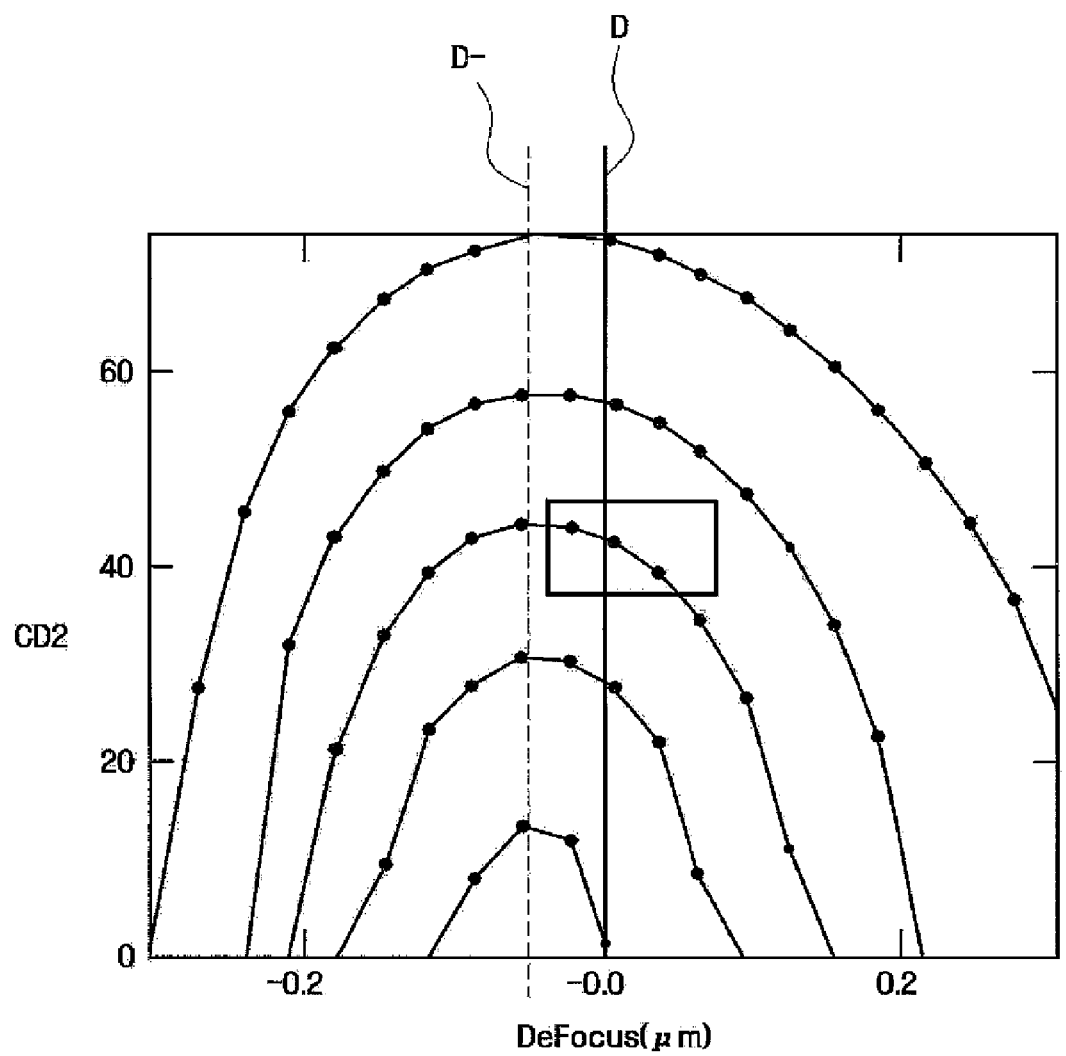
Figure 13C:
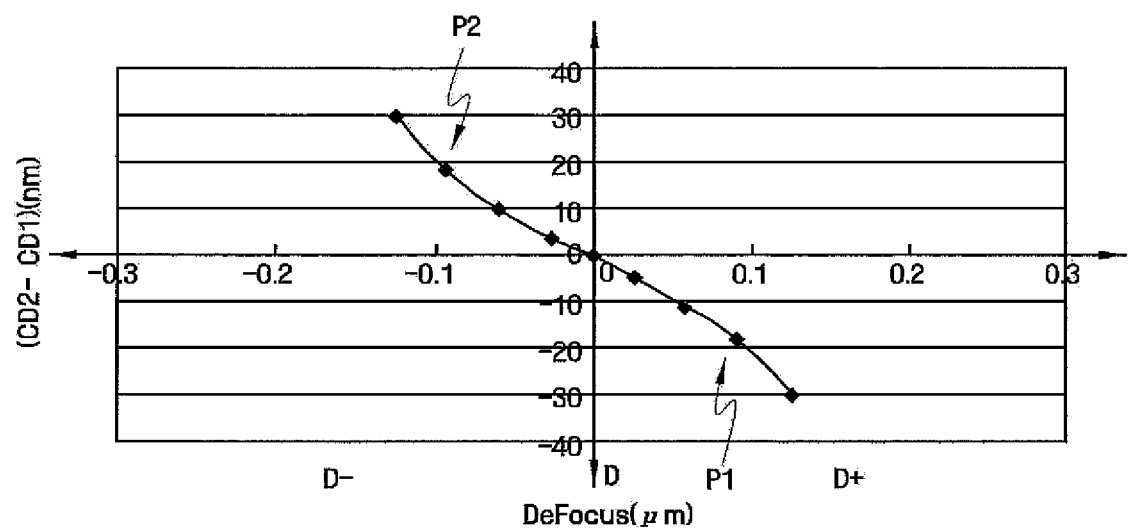
FIG. 13C is a focus response plot illustrating the determination of focus direction shift based on measured CD according to an exemplary embodiment of the invention.

FIGS. 13A~13C schematically illustrate a focal point detection method according to an exemplary embodiment of the invention, which enables the magnitude and direction of focus drift to be determined based on measured CD values of printed test structures during a photolithographic process. In particular, FIGS. 13A and 13B graphically illustrate focus-exposure matrix test data that is derived experimentally and/or via computer simulations for an exemplary mask test pattern such as depicted in FIG. 12A. FIGS. 13A and 13B are Bossung plots that illustrate the variation of CD (line width) for respective printed test structures T1' and T2' (FIG. 12B) as a function of focus and exposure energy variations. The focus-exposure matrix test data is used to build mathematical models that define the relationship/correlation between variations in focus and exposure with measured CD values for printed test structures and identify temporal (wafer to wafer) variations or wafer (spatial) variations in dies. FIG. 13C graphically illustrates a method for determining both magnitude and direction of focus drift (from best focus) as a function of difference in CD ($CD_2 - CD_1$) measurements of the printed test structures T2' and T1' in FIG. 12B.

The exemplary mask test pattern of FIG. 12A is designed in a manner such that the through-focus CD properties of the test structures T1 and T2 yield corresponding Bossung curves which are shifted in opposite directions with respect to a best focus location (e.g., 0 defocus) and which are substantially mirror images of each other. In particular, as depicted in FIG. 13A, the Bossung curves for the exemplary test structure T1 (90 degrees) are centered at a defocus position D+ which is shifted to the right of the best focus position D (which is assumed to be 0 defocus in the exemplary embodiment). Further, as depicted in FIG. 13B, the Bossung curves for the exemplary test structure T2 (270 degrees) are centered at a defocus position D– which is shifted to the left of the best focus position D. Moreover, the Bossung curves in FIG. 13A are mirror images of the Bossung curves in FIG. 13B. In other words, for a given exposure energy, the magnitude of the D+ is equal to D– and changes in focus produce changes in measured CD1 which are opposite to changes of the measured CD2. This characteristic results a relationship in which the magnitude of the difference in CD ($CD_2 - CD_1$) changes linearly as function of +/– focus drifts from the best focus position (e.g., 0 defocus) for the given process.

For example, FIG. 13C illustrates the difference in CD ($CD_2 - CD_1$) in nm (Y-axis) as a function of defocus (um) (x-axis) for the data depicted in the windows of FIGS. 13A and 13B. In the exemplary embodiment, at the 0 defocus position D (best focus), the difference ($CD_2 - CD_1$)=0 indicates that the focal point of the process is at the best focus. At point P1, a measurement of $CD_2 - CD_1$ of about +20 nm would indicate a focus drift in the process to a defocused state of about –0.10 micron, whereas at point P2, a measurement of ($CD_2 - CD_1$) of about –20 nm would indicate a focus drift in the process to a defocused state of about +0.10 micron. Thus, FIG. 13C illustrates a method to enable both the magnitude and direction of focus shift.

The exemplary mask test pattern of FIG. 12A can be incorporated in photomask structures to provide printed test structures that can be used to accurately and efficiently determine both magnitude and direction of focus drift in a lithographic manufacturing process based on a relative difference between measured CDs (line widths) of the printed test structures. Photomask structures can be constructed having circuit layout patterns and one or more test pattern structures strategically located at different positions within the device pattern such that such resulting printed test patterns can be easily detected and identified for CD measurements while not adversely affecting the performance of the semiconductor device having the printed test patterns. For example, the photomask test structures can be formed such that the resulting printed test structures are formed in scribe lines (or spaces) between the different dies of a wafer that allow separation of the chip from the wafer.

For a given photolithography process, focus-exposure matrix data such as depicted in FIGS. 13A and 13B can be obtained for each level of photomask for the given process to thereby construct models or formulas that quantify the amount and direction of defocus based on difference between the CDs of printed test structures (such as graphically depicted in FIG. 13C.). For example, prior to photomask production, photolithography simulation tools can be used to accurately simulate lithography manufacturing processes and predict the behavior of circuit layouts having exemplary mask test patterns (such as depicted in FIG. 12A) in response to variations in lithographic process parameters. For example, simulations may be performed using any known commercial simulation tool to simulate variations in critical dimensions caused by changes in process parameters (e.g., focus variation) for a given layout pattern. For the simulation, photolithography tool settings such as focus, dose, and a number of other process parameters such as stepper settings, resist parameters, and other parameters that affect CD can be input to the simulation tool and processed. The simulation tool can calculate changes in critical dimensions corresponding to drifts in both the dose and focus of the exposure tool and create a matrix of focus-exposure data. Lithographic simulation tools include methods for constructing comprehensive models of a lithography process across the entire focus and exposure window. The results of the simulation can be used to construct test reticles. These test reticles can be used to experimentally obtain FEM data that can be utilized in conjunction with simulation data to modify or otherwise optimize the lithographic process models and formulas for, e.g., determining variation in focus (FIG. 13C).

Figure 14:
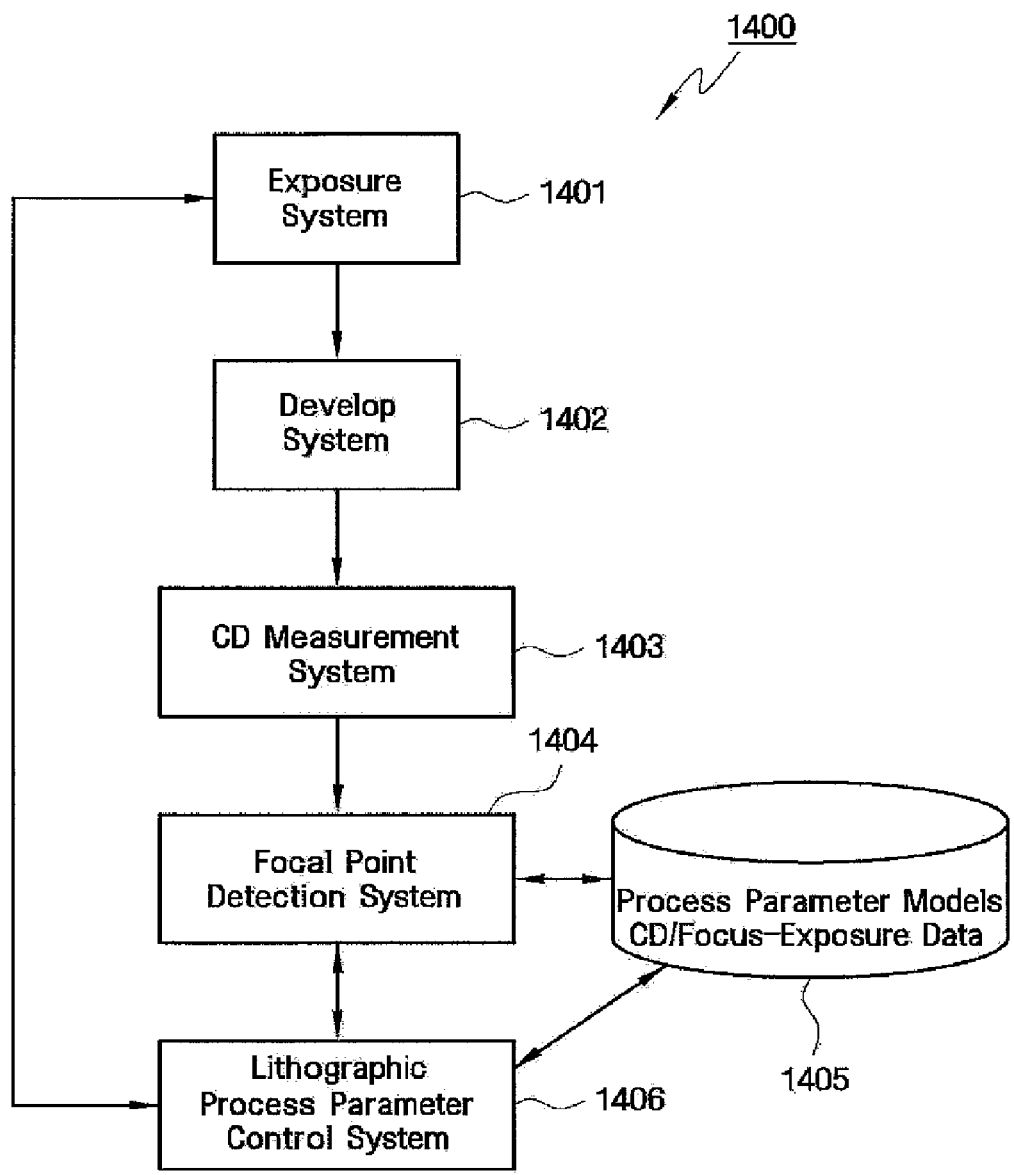
FIG. 14 schematically illustrates an optical wafer inspection system used for detecting process changes in accordance with one embodiment of the present invention.

FIG. 14 is a high-level schematic diagram of photolithography system (1400) which implements a focal point monitoring system according to an exemplary embodiment of the invention. In general, the system (1400) comprises an exposure system (1401), a photoresist develop system (1402), a CD measurement system (1403), a focal point detection system (1404), a repository (1405) of process parameters models and FEM data, and a process parameter control system (1406).

The exposure system (1401) includes an exposure tool to expose a photoresist coated wafer with light through a photomask having a mask pattern including a circuit layout pattern, as well as a test structure pattern according to an exemplary embodiment of the invention. The exposure system (1401) may comprise any one of known systems such as a reduction projection exposure system (a stepper), wherein the mask pattern is projected onto the photoresist with reduced size. The initial process parameters of the exposure tool, such as best focus and best exposure dose, are set according to the optimal parameters as determined by the FEM data associated with the given photomask. The stepper machine exposes the reticle onto the wafer using step-and-scan-procedure. Following exposure, the exposed wafer is sent to the develop system (1402), wherein the exposed photoresist pattern is first subjected to a post exposure bake process, and then subjected to chemical processing to remove the exposed (or unexposed) regions of the photoresist. The result of the exposure/development process is the wafer having a patterned resist layer.

Following the develop process the resist patterned wafer is sent to the CD measurement system (1403), wherein the CDs of the printed test structures are measured, for example. The CD measurement system (1403) may be part of a wafer inspection system that allows automated and/or manual inspection of wafer to detect defects, measure dimensions of pattern features, etc. The CD measurement tool (1403) can be implemented using known metrology tools include optical overlay tools, scatterometers, scanning electron microscopes and atomic force microscopes. The CD measurement tool (1403) can measure the CD of the printed test structure(s) directly by optically measuring the line width, or by using image processing methods that determine the CD by comparing a current optical image with one or more baseline images associated with the given photomask and exposure conditions.

The focal point detection system (1404) processes the measured CD data to detect variations in focus as the wafers are printed. In particular, as described above, the magnitude and direction of a drift in focus of the lithographic process can be determined by determining the difference in the measured CDs of the printed test structures and correlating the CD difference value to the focus/exposure variations using the corresponding process parameter mathematical model(s) for the given printed test structure. If the measured CDs vary, the focal point detection system (1404) will generate and output a suitable control signal/parameter to the process parameter control system (1406) to make any necessary adjustments to the process parameters (focus) of the exposure tool (1401). In one exemplary embodiment, the functions of the monitoring and control systems (1404) and (1406) may be fully automated. In other exemplary embodiments, the functions may be semi automated whereby, for example, the focal point detection system (1404) alerts a human operator as to the focus variation, which allows the operator to verify and confirm the process variation and then manually adjust the process parameter(s) of the exposure system or provide appropriate command to the process parameter control system (1406) to make the required adjustment(s).

It is to be understood that the exemplary system and methods described herein may be implemented in various forms of hardware, software, firmware, special purpose processors, or a combination thereof. In one exemplary embodiment, the exemplary embodiments can be implemented in software as an application comprising program instructions that are tangibly embodied on one or more program storage devices (e.g., hard disk, magnetic floppy disk, RAM, CD Rom, DVD, ROM, flash memory, etc.), and executable by any device or machine comprising suitable architecture. It is to be further understood that since the exemplary system modules and method steps depicted in the accompanying Figures may be preferably implemented in software, the actual connections between the system components (or the flow of the process steps) may differ depending upon the manner in which the application is programmed. Given the teachings herein, one of ordinary skill in the related art will be able to contemplate these and similar implementations or configurations of the present invention.

It is to be understood that mask test patterns according to exemplary embodiment of the invention can be used with bright field, dark field, or phase shifting masks or with reticles designed for other radiation sources, and can be used with lithographic processes involving positive or negative photoresist, bilayer, multilayer or surface imaging resist.

Although exemplary embodiments have been described herein with reference to the accompanying drawings, it is to be understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

I claim:

1. A method for monitoring focus of a lithographic process, the method comprising: obtaining a semiconductor wafer having a photoresist pattern formed thereon, the photoresist pattern including a printed test pattern comprising first and second printed test features; determining a printed critical dimension CD1 of the first printed test feature and a printed critical dimension CD2 of the second printed test feature; determining a relative CD difference between the printed critical dimensions CD2 and CD1; and determining a magnitude and direction of defocus from a best focus setting for the lithographic process based on the determined relative CD difference, wherein the printed test pattern is formed such that a linear relationship exists between an amount of defocus and the relative CD difference.

2. The method of claim 1, further comprising automatically adjusting a focus setting of an exposure tool to correct a defocus condition.

3. The method of claim 1, wherein the focus setting is deemed to be at the best focus setting when the relative CD difference is determined to be about 0.

4. The method of claim 1, comprising constructing a lithographic process model that quantifies the linear relationship between defocus and relative CD difference using corresponding focus-exposure matrix data.

5. The method of claim 1, wherein the printed critical dimensions CD1 and CD2 are determined automatically.

6. The method of claim 1, wherein obtaining the semiconductor wafer comprises printing an image of a mask pattern of a photomask into a photoresist layer formed on a semiconductor wafer, wherein the mask pattern comprises a mask test pattern comprising first and second test features that are formed having at least one feature size equal to a design CD.

7. The method of claim 6, wherein the first and second test features are structured to form the first and second printed test features having through-focus CD properties which yield respective first and second focus-exposure curves that are shifted in equal and opposite directions with respect to a best focus position and which are substantially minor images over the best focus position.

8. The method of claim 1, wherein the first and second printed test features are elongated bar elements separated by a pitch P, and wherein the printed critical dimensions CD1 and CD2 are determined by measuring respective widths of the printed bar features.

9. The method of claim 8, wherein P is in a range of about 10 times a design CD or greater.

10. The method of claim 8, comprising forming the printed test pattern in a photoresist layer by transferring an image of a mask test pattern formed on a photomask device.

11. The method of claim 10, wherein the mask test pattern comprises a first elongated bar element and a second elongated bar element separated by a pitch P, wherein the first and second bar elements have line widths equal to a design CD, wherein the first elongated bar element comprises an inner non-printing feature adapted to provide substantially 100% transmittance of 90 degree phase shifted light, and wherein the second elongated bar element comprises an inner non-printing feature adapted to provide substantially 100% transmittance of 270 degree phase-shifted light.

12. A program storage device readable by machine, tangibly embodying a program of instructions executable by the machine to perform method steps for monitoring focus of a lithographic process, the method steps comprising: obtaining a semiconductor wafer having a photoresist pattern formed thereon, the photoresist pattern including a printed test pattern comprising first and second printed test features; determining a printed critical dimension CD1 of the first printed test feature and a printed critical dimension CD2 of the second printed test feature; determining a relative CD difference between the printed critical dimensions CD2 and CD1; and determining a magnitude and direction of defocus from a best focus setting for the lithographic process based on the determined relative CD difference, wherein the printed test pattern is formed such that a linear relationship exists between an amount of defocus and the relative CD difference.

13. The program storage device of claim 12, further comprising instructions for automatically adjusting a focus setting of an exposure tool to correct a defocus condition.

14. The program storage device of claim 12, wherein the focus setting is deemed to be at the best focus setting when the relative CD difference is determined to be about 0.

15. The program storage device of claim 12 further comprising instructions for constructing a lithographic process model that quantifies the linear relationship between defocus and relative CD difference using corresponding focus-exposure matrix data.

* * * * *